US008232203B2

(12) United States Patent  
Yang

(10) Patent No.: US 8,232,203 B2
(45) Date of Patent: Jul. 31, 2012

(54) METHODS OF MANUFACTURING MEMORY DEVICES

(75) Inventor: Chin Cheng Yang, Gangshan Town (TW)

(73) Assignee: Macronix International Co., Ltd., Hsin-Chu (TW)

(*) Notice: Subject to any disclaimer, the term of this patent is extended or adjusted under 35 U.S.C. 154(b) by 108 days.

(21) Appl. No.: 12/763,861

(22) Filed: Apr. 20, 2010

(65) Prior Publication Data

US 2011/0159682 A1 Jun. 30, 2011

(30) Foreign Application Priority Data

Dec. 24, 2009 (TW) ................ 98144814 A

(51) Int. Cl.
*H01L 21/44* (2006.01)
(52) U.S. Cl. ............ 438/669; 438/598; 257/E21.585
(58) Field of Classification Search .......... 438/669, 438/598, 620
See application file for complete search history.

(56) References Cited

U.S. PATENT DOCUMENTS

2004/0121570 A1* 6/2004 Chung et al. .............. 438/586
2009/0186477 A1* 7/2009 Shin et al. ................. 438/618

* cited by examiner

*Primary Examiner* — Charles Garber
*Assistant Examiner* — Reema Patel
(74) *Attorney, Agent, or Firm* — Alston & Bird LLP

(57) ABSTRACT

A method of manufacturing a memory device is disclosed. The method includes providing a substrate, forming a number of memory sectors on the substrate, wherein each of the memory sectors is coupled to an adjacent one via a first diffused region in the substrate and is coupled to another adjacent one via at least one second diffused region in the substrate, forming a first dielectric layer on the memory sectors, forming a first conductive structure through the first dielectric layer to the first diffused region, and at least one second conductive structure through the first dielectric layer to the at least one second diffused region, forming a patterned first mask layer on the first dielectric layer, the first conductive structure and the at least one second conductive structure, the patterned first mask layer exposing the first conductive structure, and etching back the first conductive structure.

14 Claims, 23 Drawing Sheets

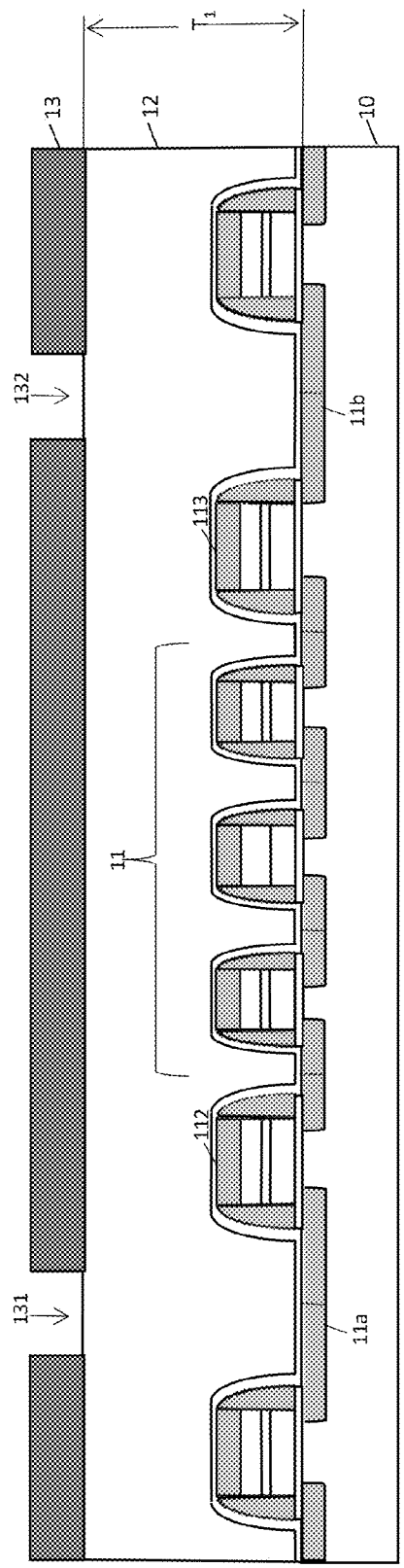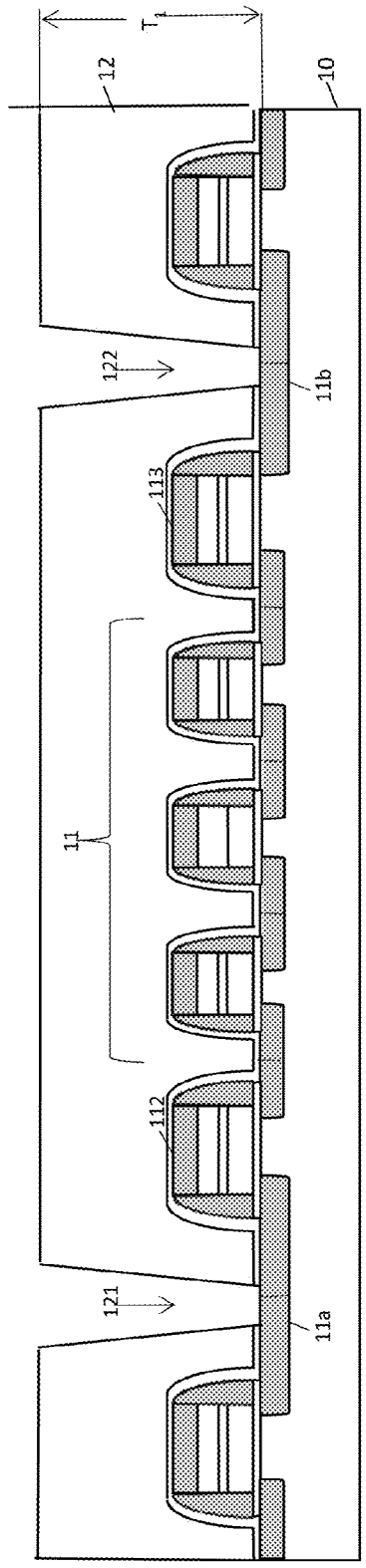
FIG. 1A (PRIOR ART)
FIG. 1B (PRIOR ART)

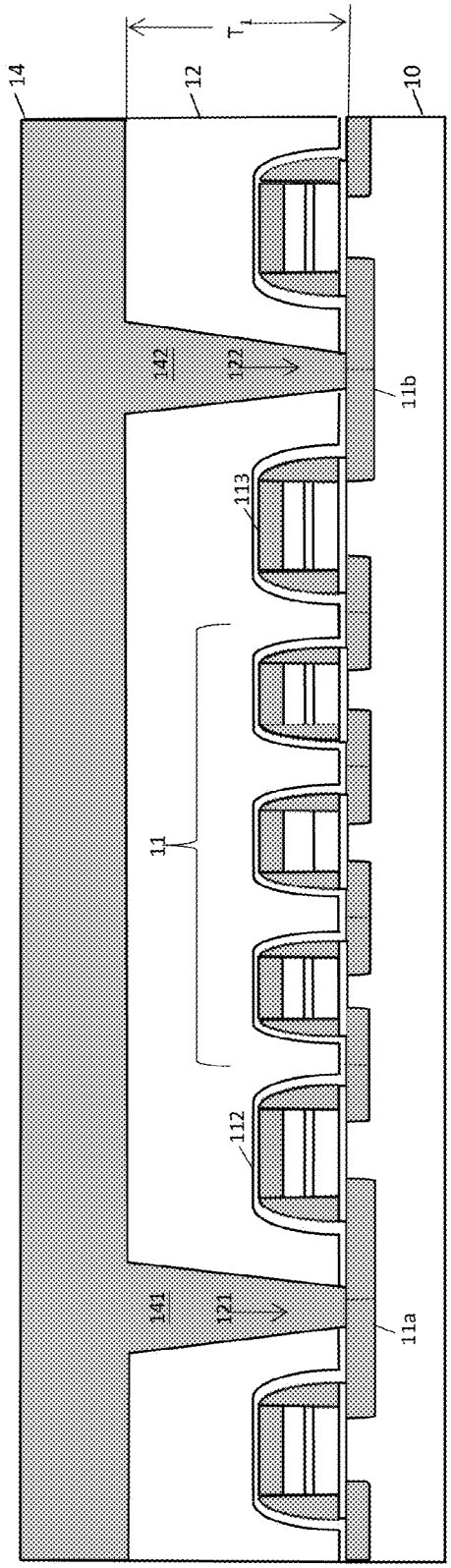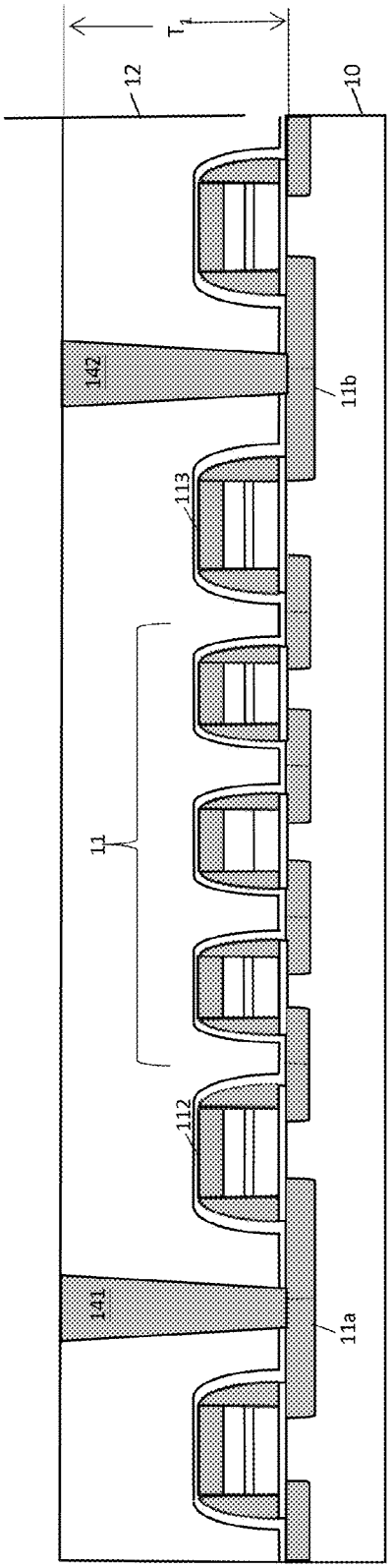

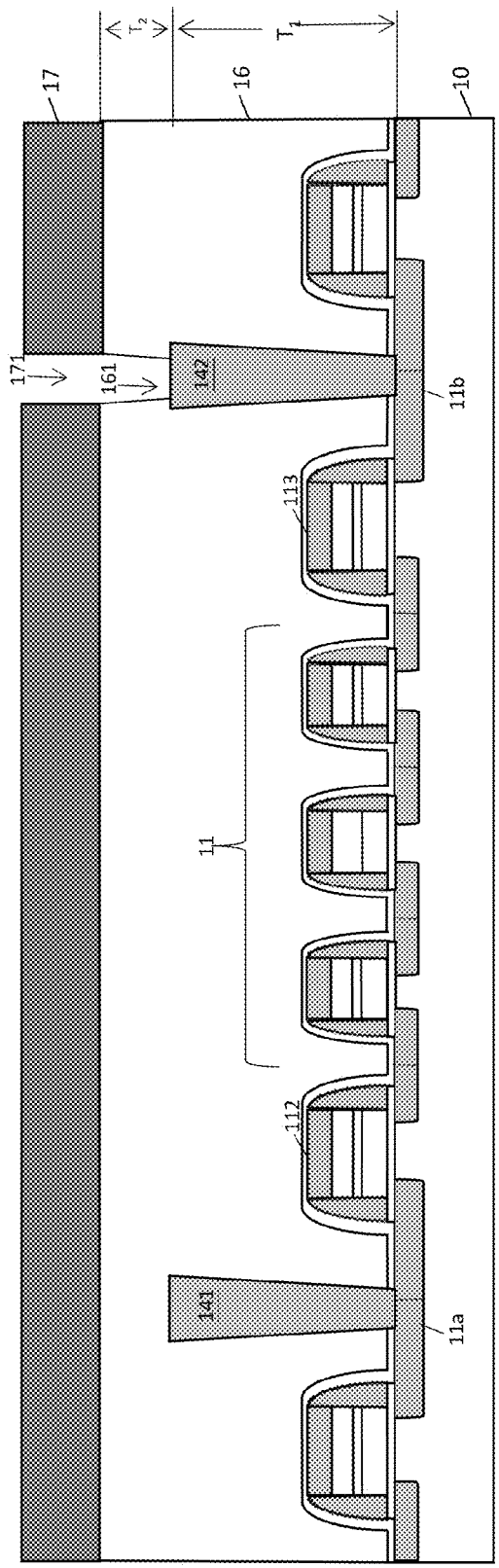
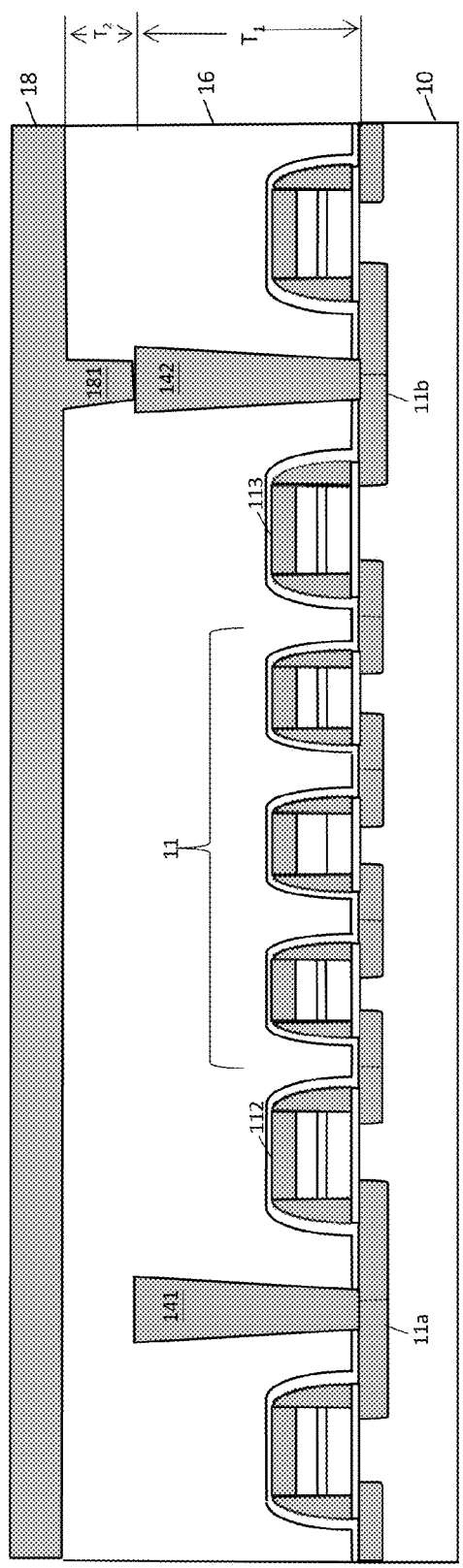
FIG. 1G (PRIOR ART)
FIG. 1H (PRIOR ART)

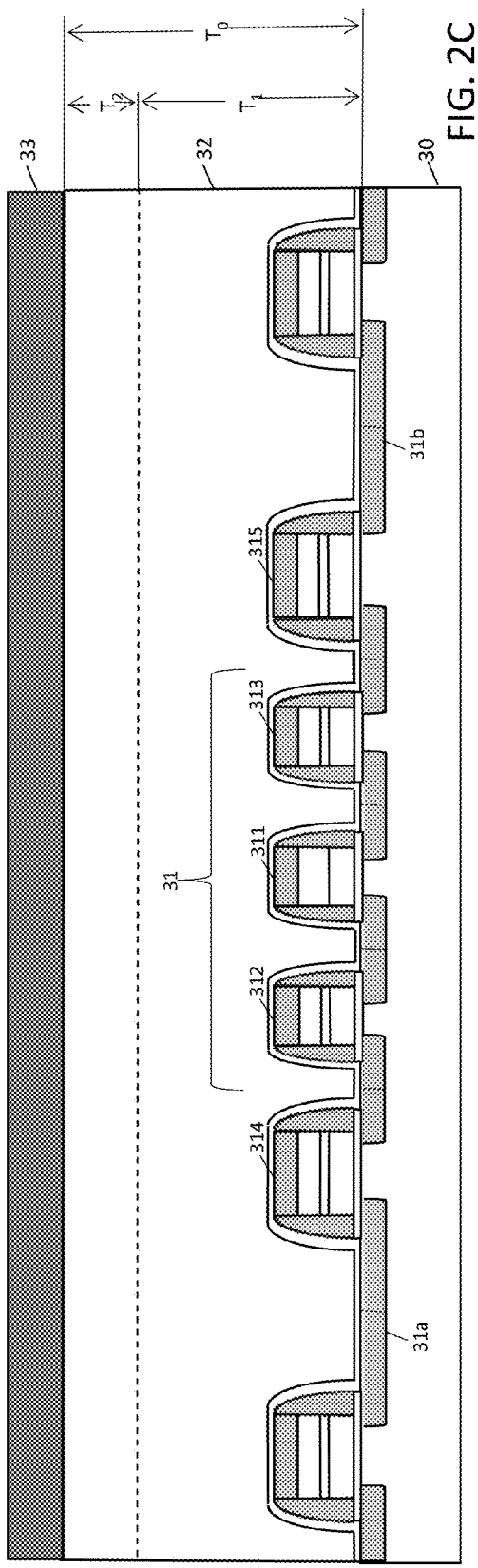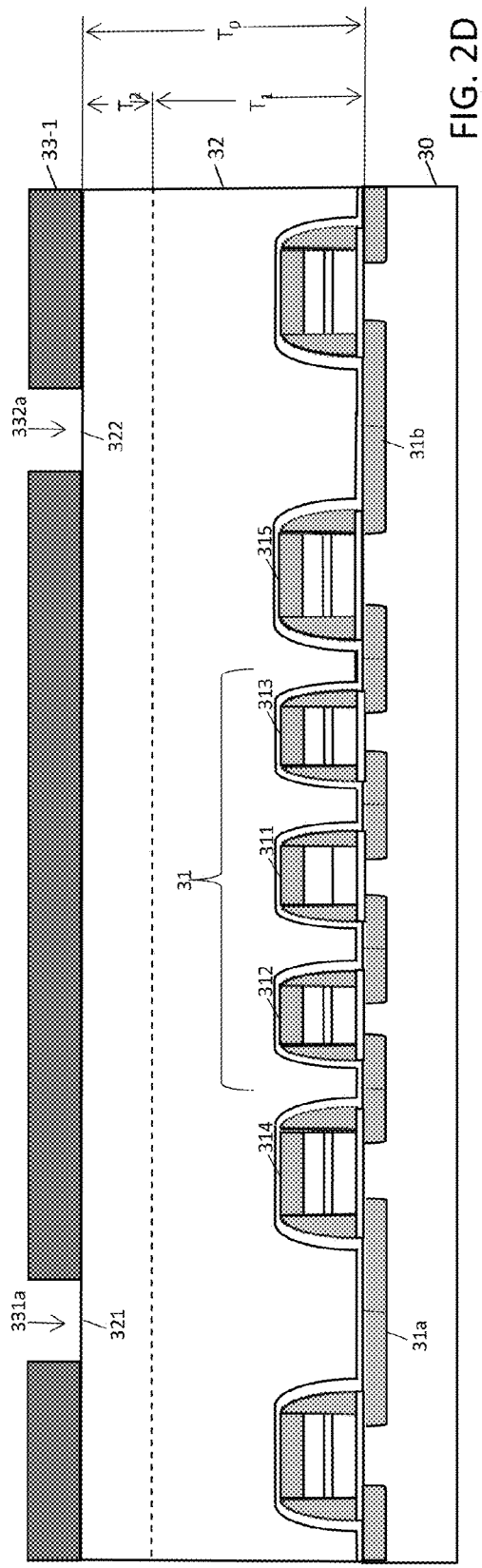

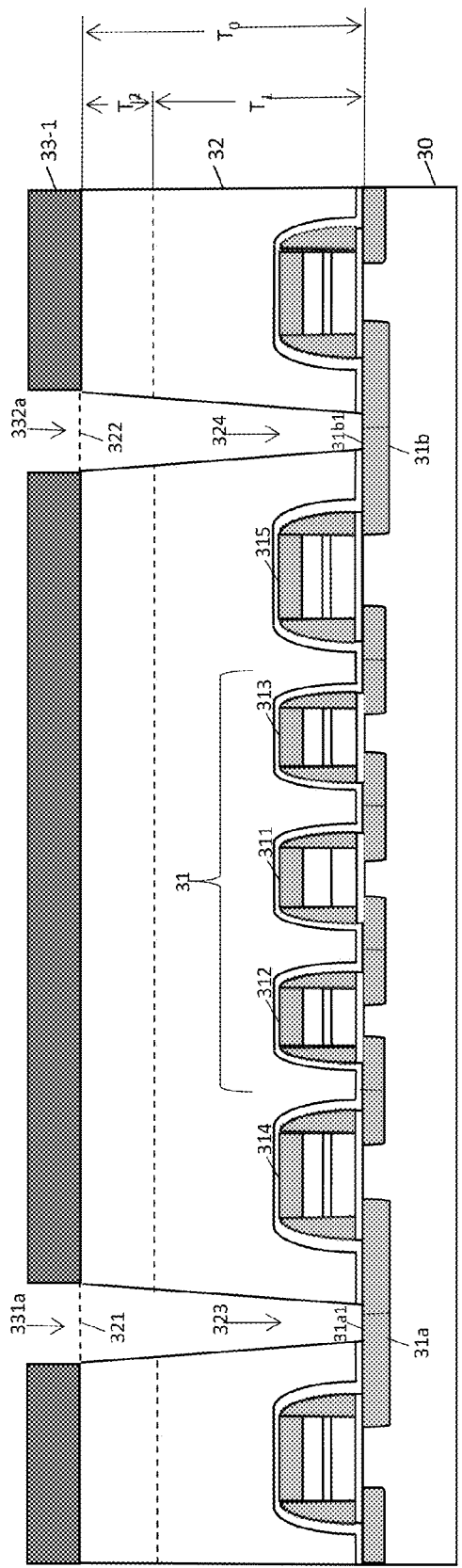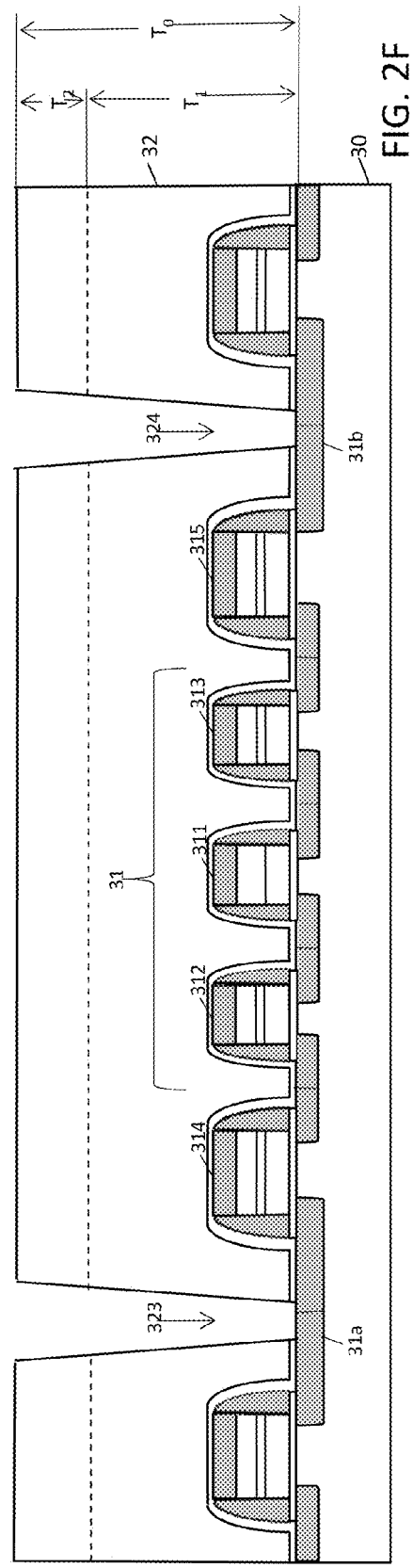

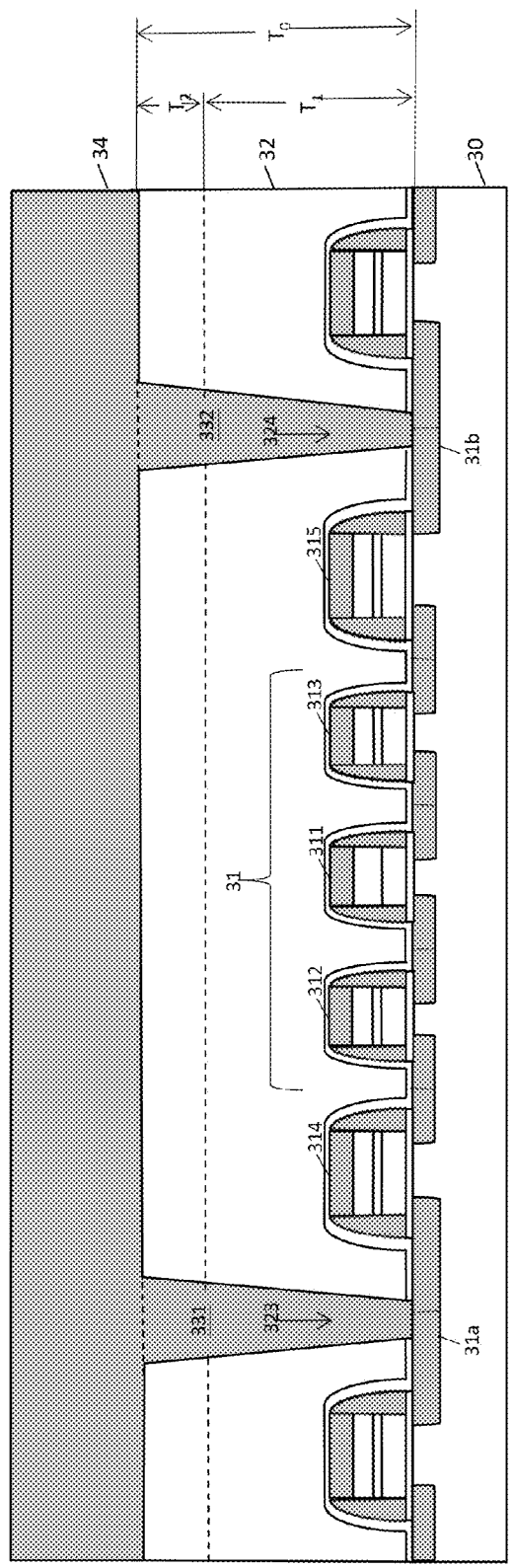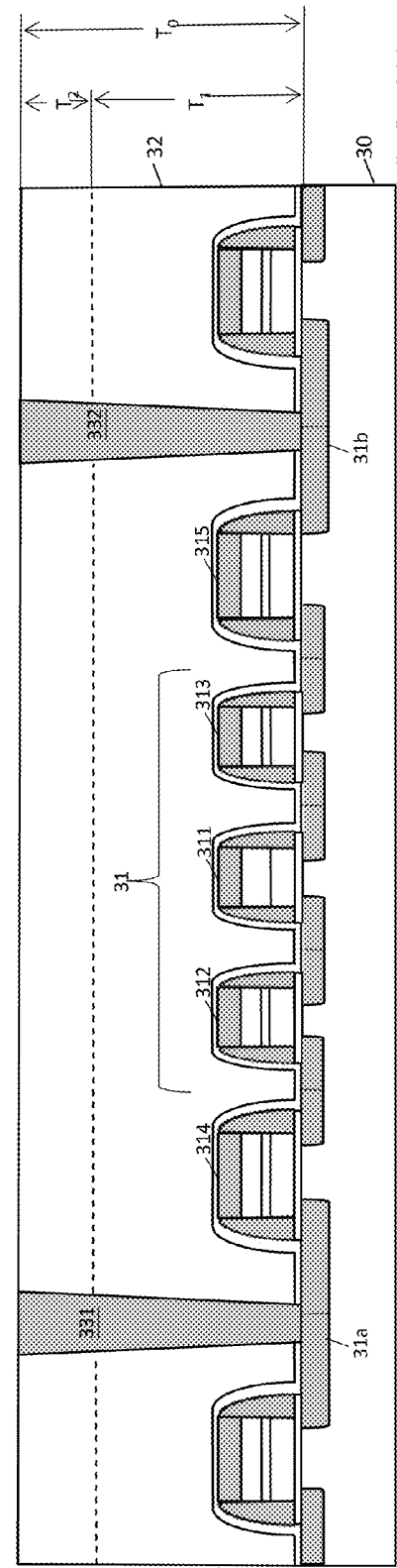

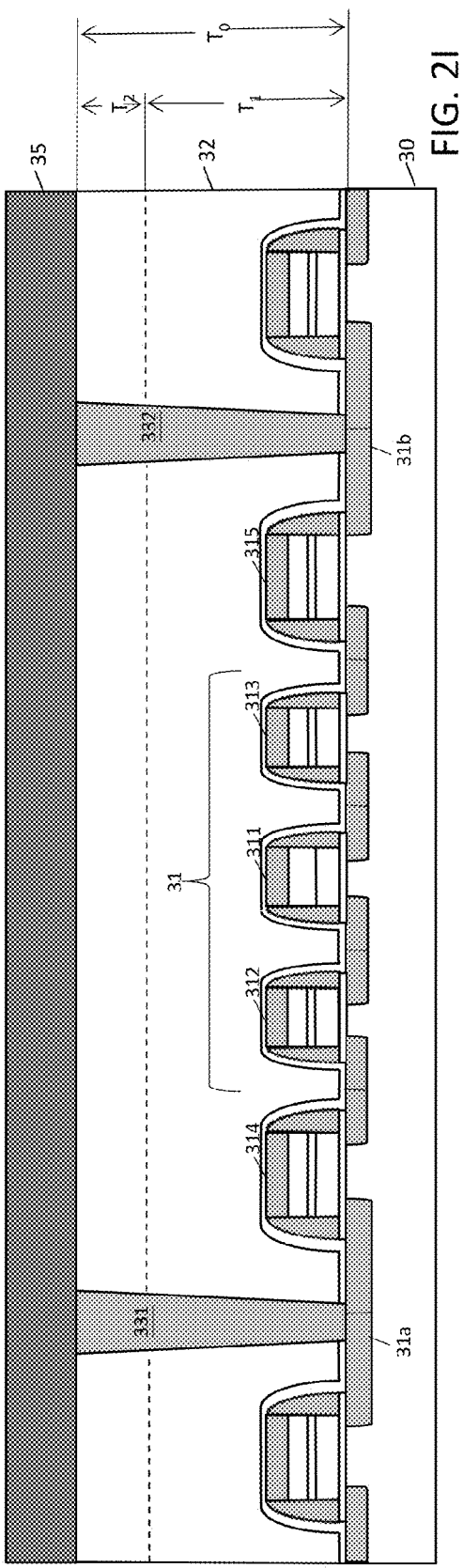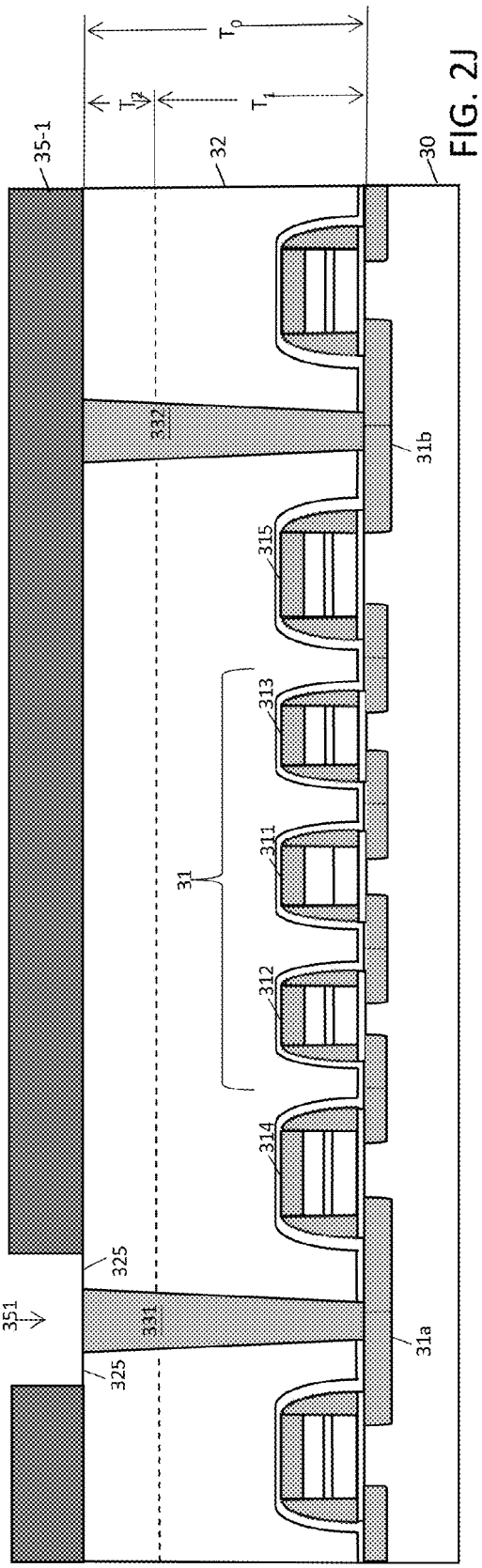

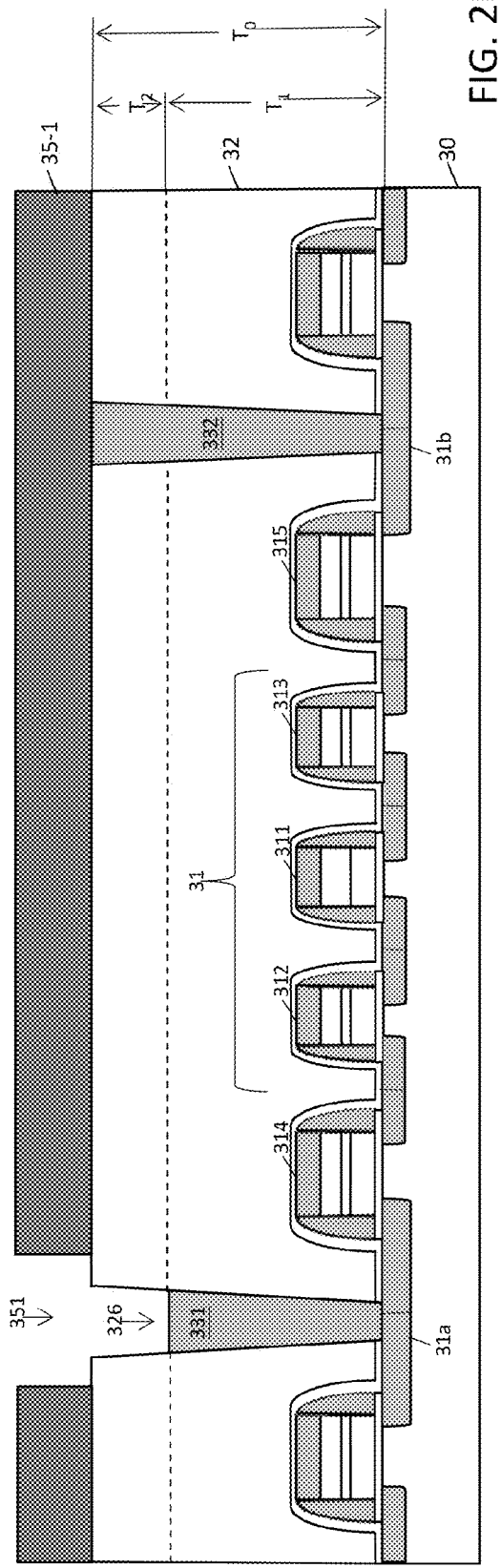
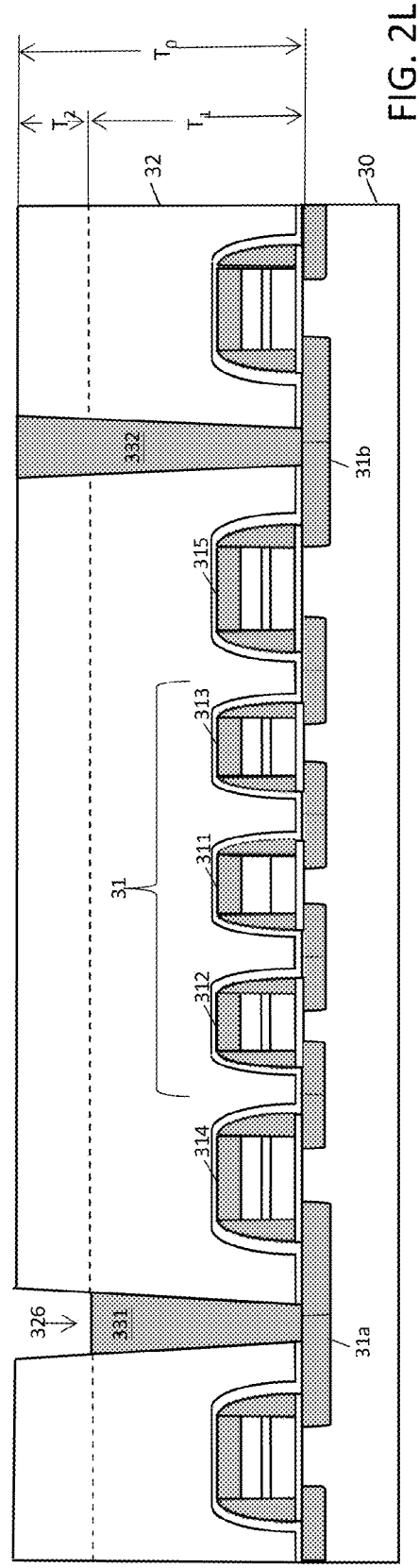

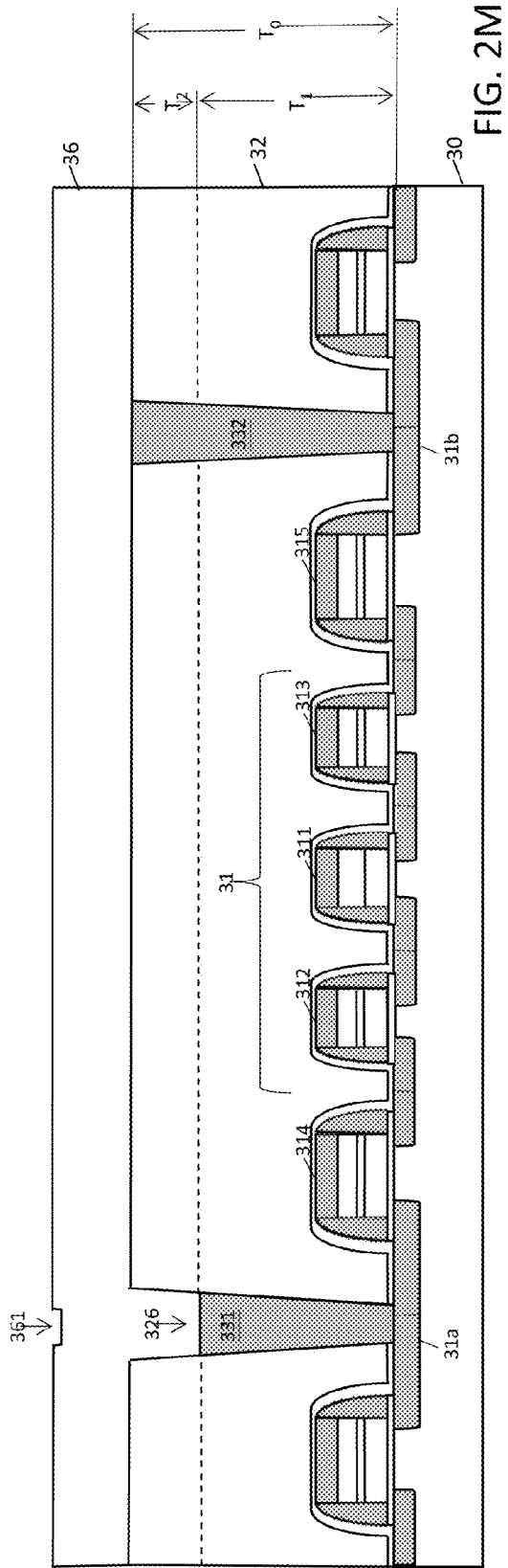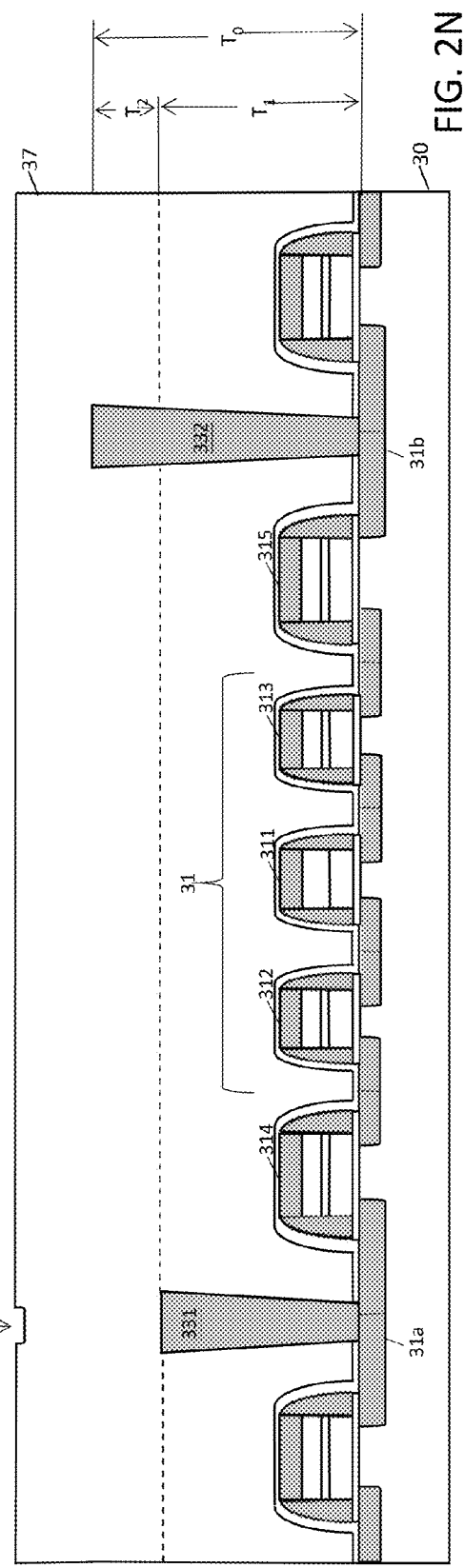

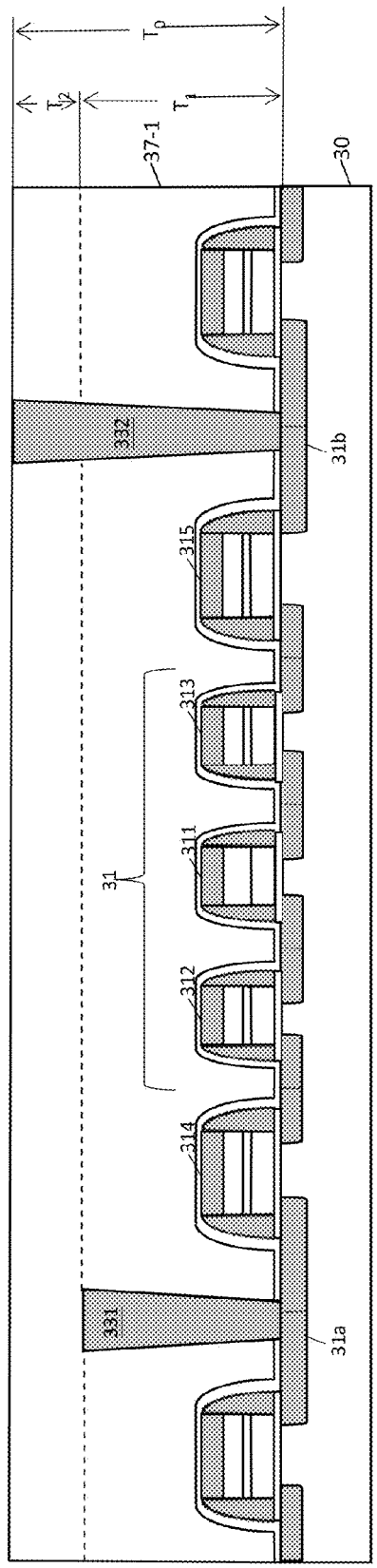
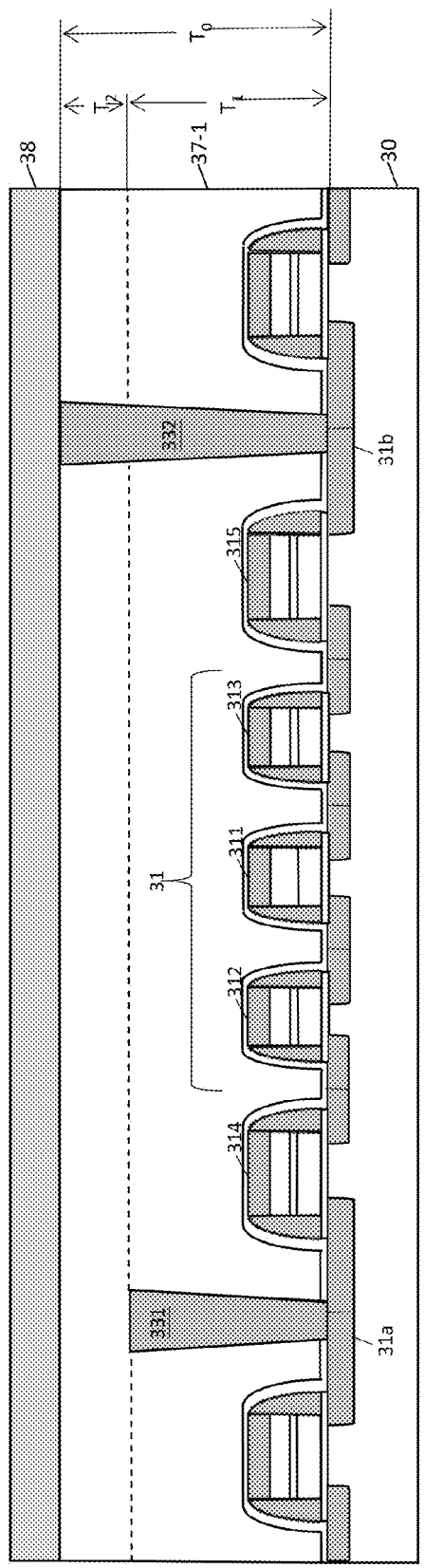
FIG. 2O
FIG. 2P

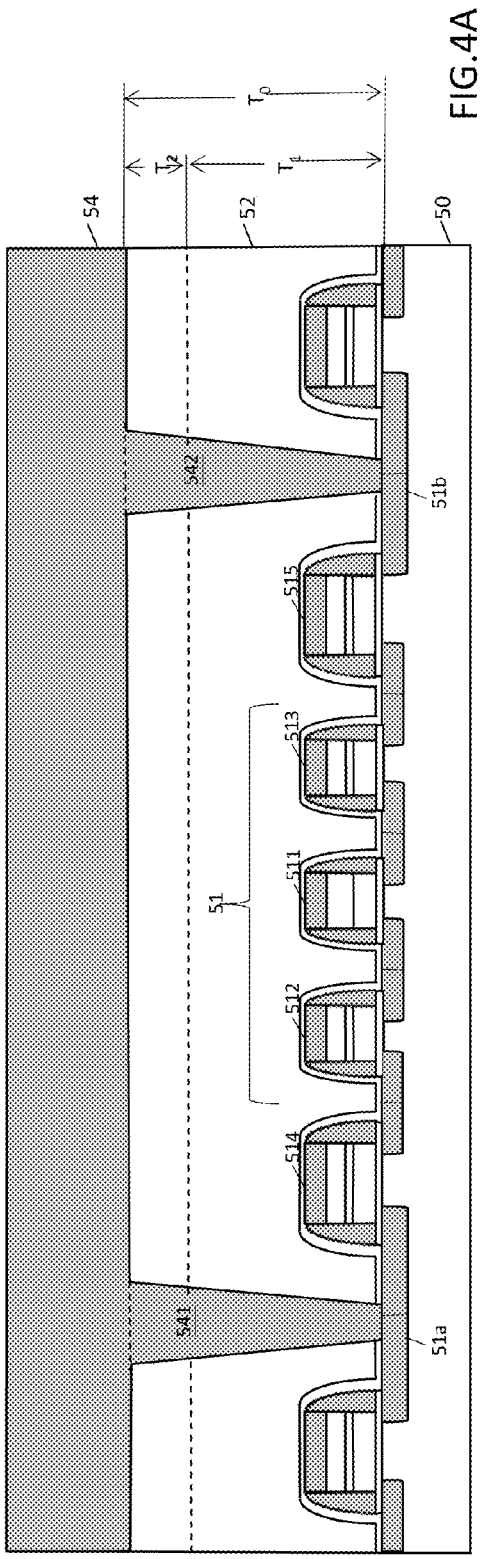
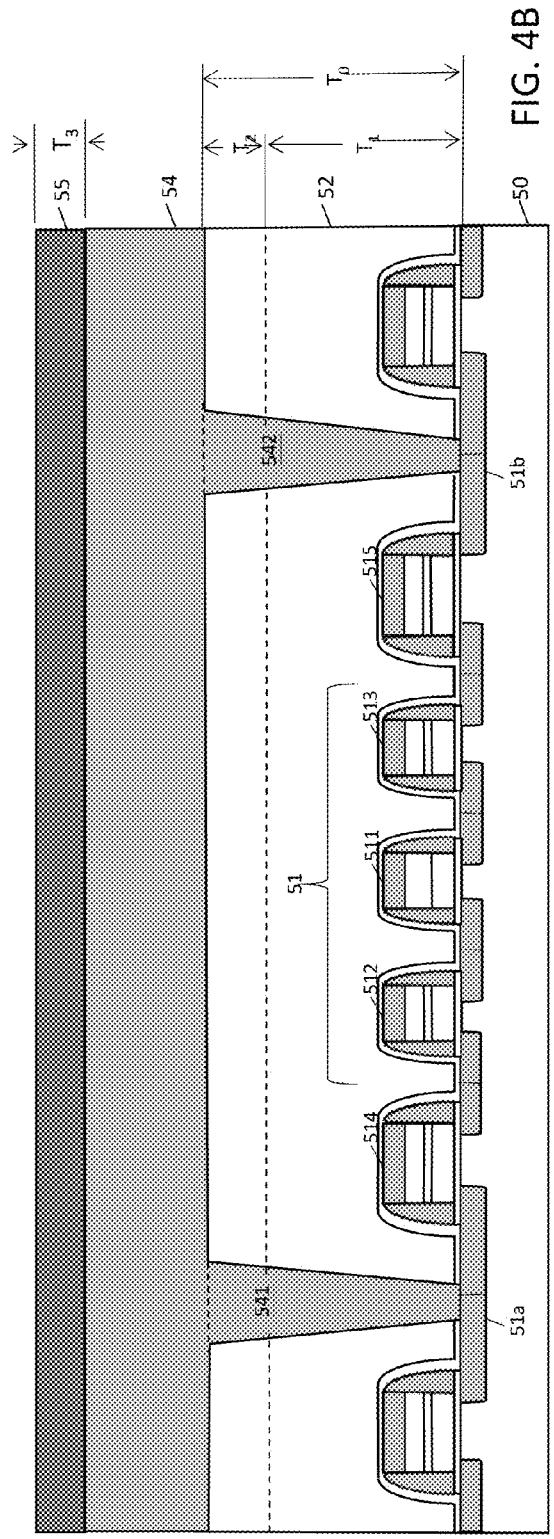
FIG. 4A
FIG. 4B

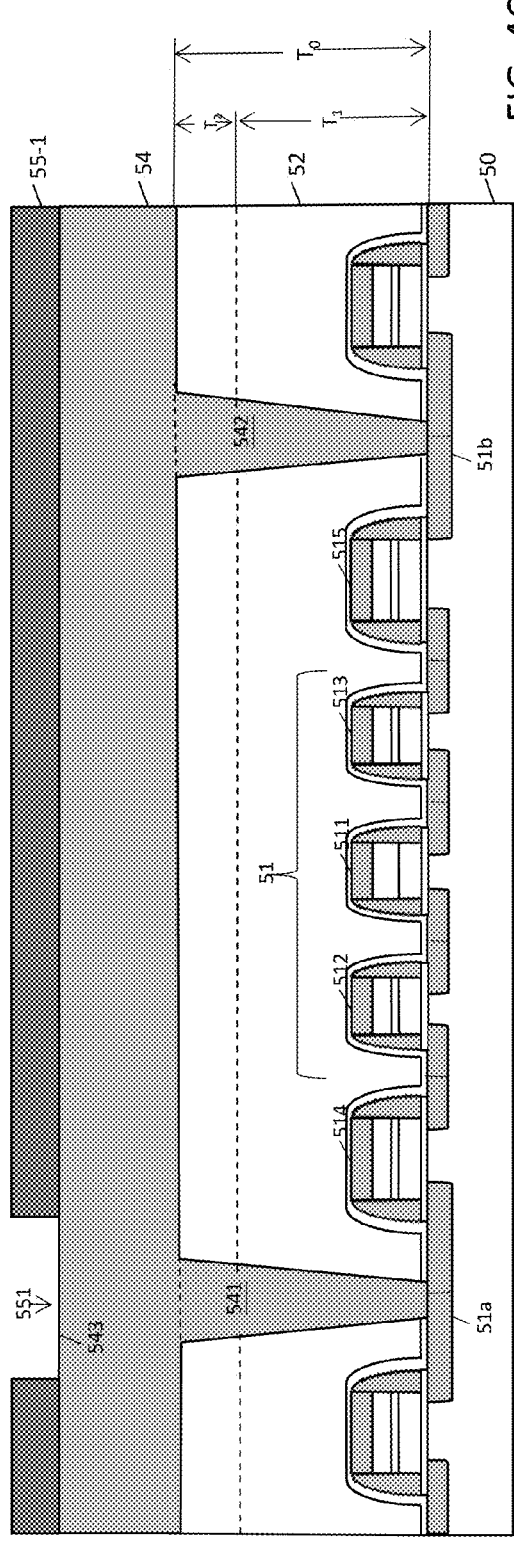
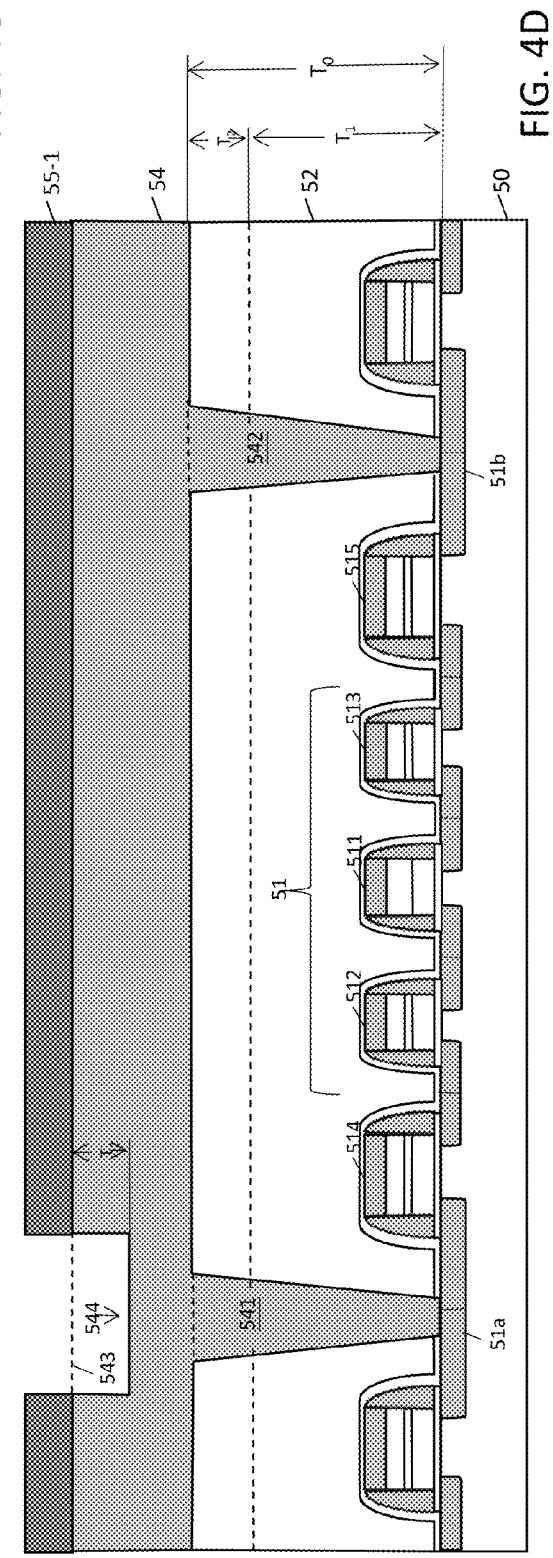
FIG. 4C
FIG. 4D

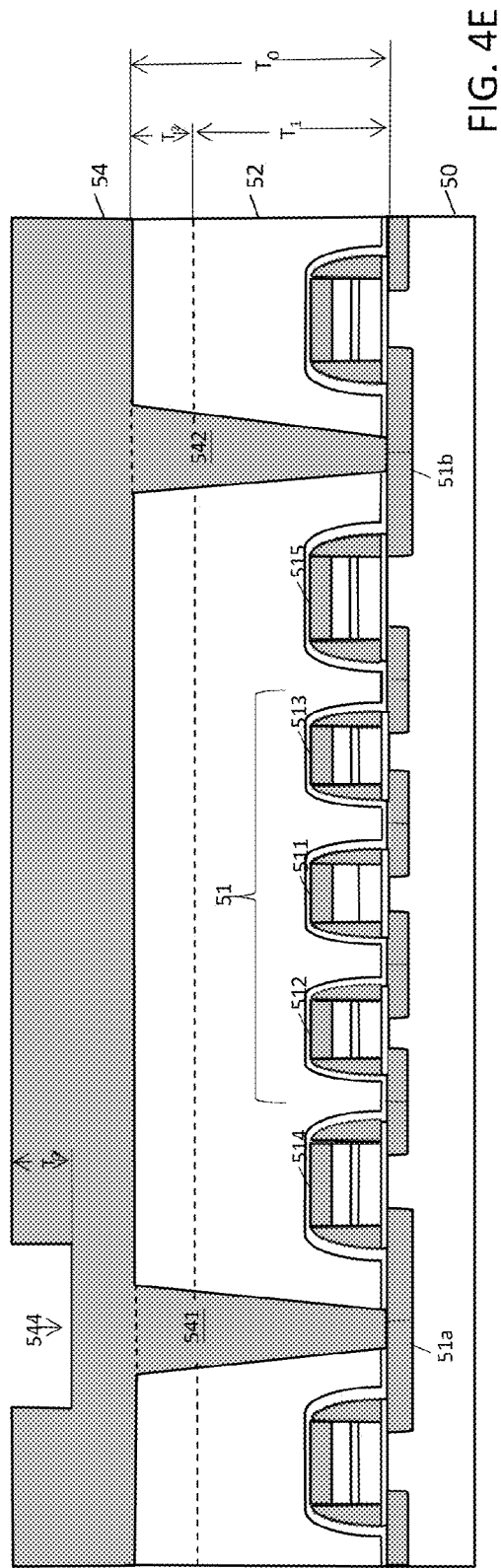
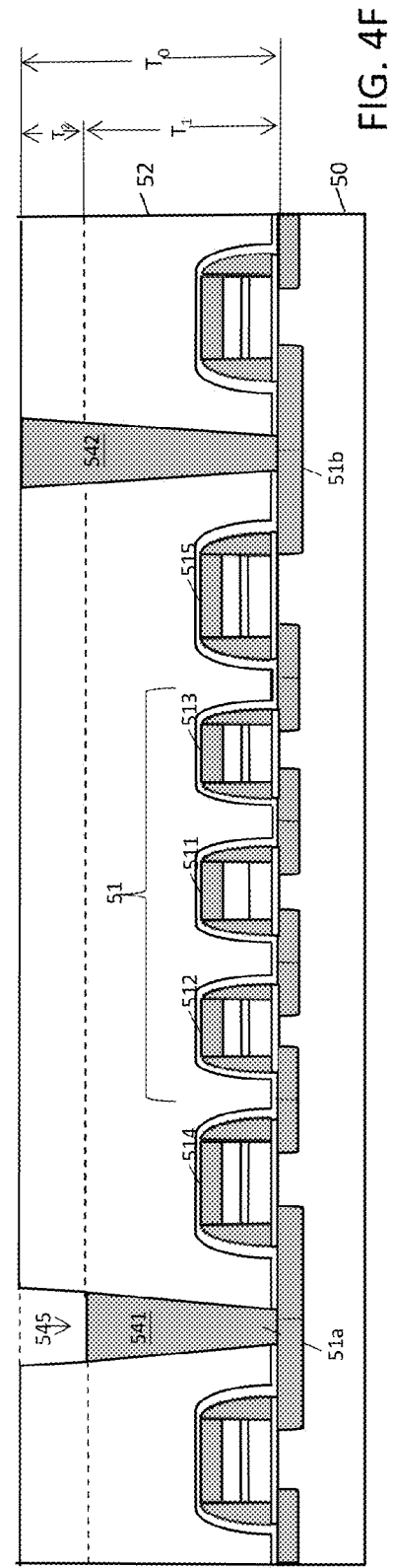
FIG. 4E
FIG. 4F

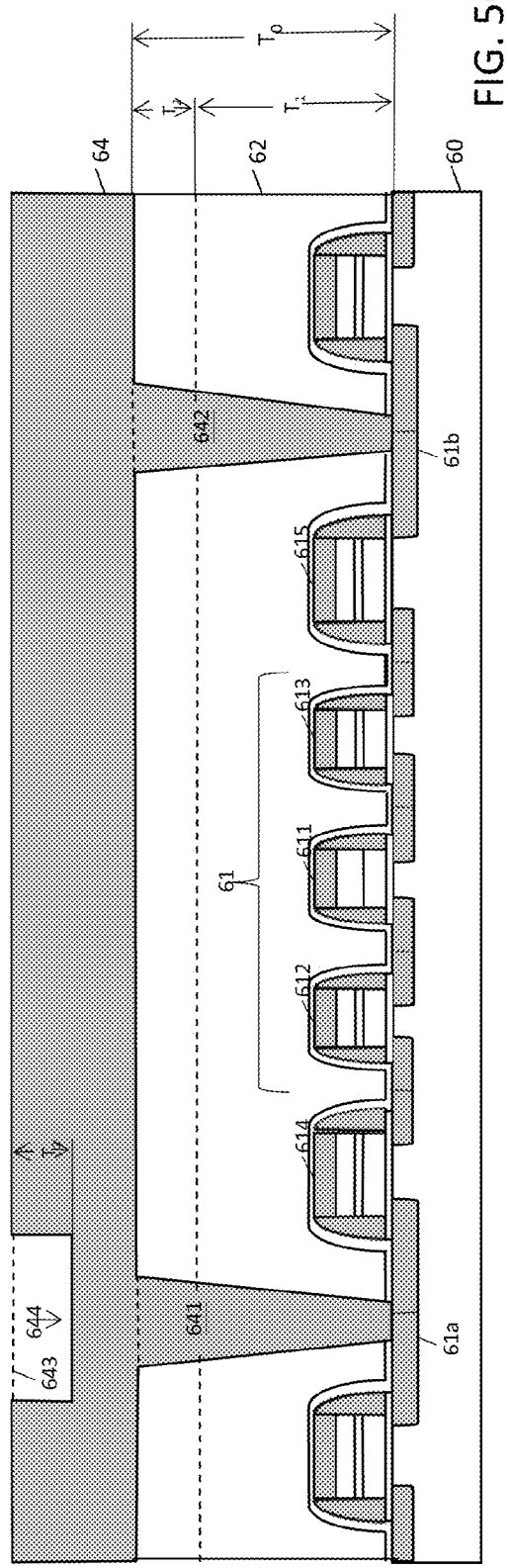
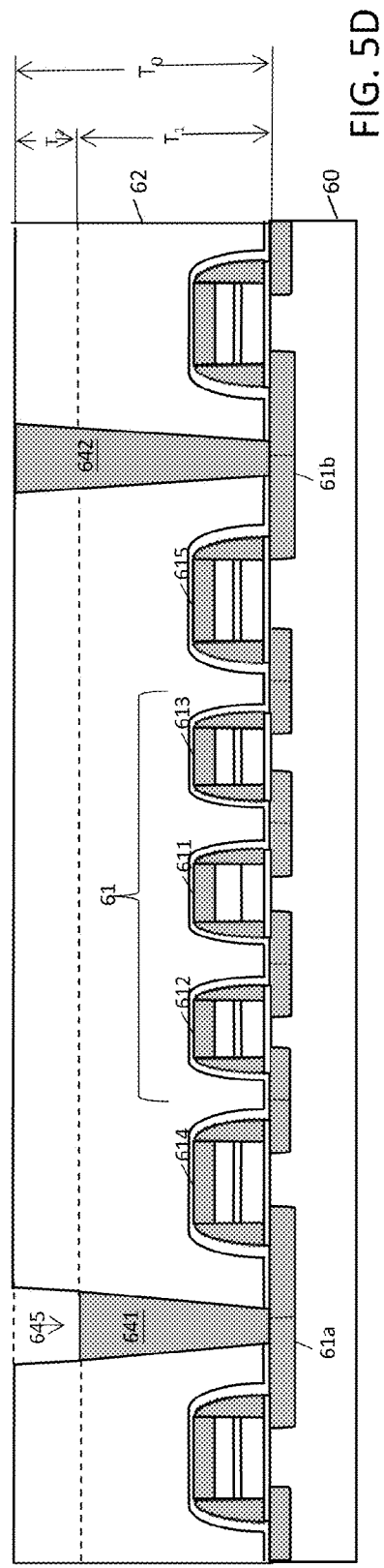
FIG. 5C
FIG. 5D

METHODS OF MANUFACTURING MEMORY DEVICES

BACKGROUND OF THE INVENTION

The present invention generally relates to a method of fabricating a memory device and, more particularly, to a method of fabricating a NAND flash device.

In a NAND flash device, a common-source-line contact may be disposed beside NAND strings for source line pick-up, while a plurality of drain contacts and bit-line contact plugs may be disposed for electrically coupling a common drain region of the NAND strings with the bit lines. To ensure electrical connection, each of the bit-line contact plugs is required to overlay and vertically aligned with a corresponding one of the drain contacts, and hence a complex lithography process may be needed. However, mis-alignment between the bit-line contact plugs (also termed "via0") and the drain contacts (also termed "contact") may occur, as will be discussed below.

FIGS. 1A to 1J are schematic cross-sectional views illustrating a method of manufacturing a NAND flash device in prior art. Throughout FIGS. 1A to 1J, only parts of the NAND flash device are shown for simplicity. Referring to FIG. 1A, a substrate 10 may be provided. A NAND string 11, a source select gate 112, a drain select gate 113, a common source region 11a and a common drain region 11b, which are electrically coupled with one another in series and arranged in a first reference direction, i.e., a direction horizontally across the plane of the page of the diagram of FIG. 1A, may be formed on the substrate 10. A first dielectric layer 12 with a height $T_1$ may be formed on the NAND string 11, the source select gate 112, the drain select gate 113, the common source region 11a and the common drain region 11b by a deposition process. The first dielectric layer 12 may include a dielectric material such as silicon oxide ($SiO_2$) or silicon oxynitride (SiON). A patterned first mask layer 13 of photo-resist with a first opening 131 and a plurality of second openings 132 may be formed on the first dielectric layer 12. The first opening 131 may extend in a second reference direction, i.e., a direction perpendicular to the plane of the page of the diagram of FIG. 1A. Furthermore, the second openings 132 may be arranged in an array extending in the second reference direction.

Referring to FIG. 1B, a first trench 121 and a plurality of first holes 122 may be formed into the first dielectric layer 12 through the first opening 131 and the second openings 132, respectively, by a dry etch process using the patterned first mask layer 13 as a mask. After the trench-forming process, the patterned first mask layer 13 may then be removed by a strip process.

Referring to FIG. 1C, a conductive material such as tungsten (W) may be deposited on the surface of the first dielectric layer 12, the first trench 121 and the first holes 122 by a chemical vapor deposition (CVD) process, filling the first trench 121 to form a first contact structure 141 and filling the first holes 142 to form a plurality of second contact structures 142. The first contact structure 141 and each of the second contact structures 142 may have a height equal to $T_1$. A first conductive layer 14 of the conductive material may then be formed thereon.

Referring to FIG. 1D, the first conductive layer 14 may be removed by a chemical-mechanical polish (CMP) process using the first dielectric layer 12 as a polish-stopping layer, exposing top of the first contact structure 141 and top of the second contact structures 142.

Referring to FIG. 1E, a second dielectric layer 15 with a height $T_2$ may be formed on the first dielectric layer 12 by a deposition process. The second dielectric layer 15 may include the same dielectric material as the first dielectric layer 12, and hence the second dielectric layer 15 may then be merged with the first dielectric layer 12 to form a third dielectric layer 16, as shown in FIG. 1F. The third dielectric layer 16 may serve as an inter layer dielectric (ILD) layer.

Referring to FIG. 1F, a patterned second mask layer 17 of photoresist with a plurality of third openings 171 may be formed on the third dielectric layer 16 by a lithography process. The third openings 171 may be arranged in an array extending in the second reference direction. Each of the third openings 171 is vertically aligned with a corresponding one of the second contact structures 142. The critical dimension of each of the third openings 171 is smaller than that of the top surface of each of the second contact structures 142.

Referring to FIG. 1G, a plurality of second holes 161 may be formed into the third dielectric layer 16 through the third openings 171 by a dry etch process using the patterned second mask layer 17 as a mask. Since the third openings 171 with a smaller critical dimension are vertically aligned with the second contact structures 142, each of the second holes 161 may expose a portion of a corresponding one of the second contact structures 142. After the hole-forming process, the patterned second mask layer 17 may then be removed.

Referring to FIG. 1H, a conductive material same as that of the first conductive layer 14 may be deposited on the third dielectric layer 16, filling the second holes 161 to form a plurality of third contact structures 181. Each of the third contact structures 181 may have a height equal to $T_2$ and may overlay the corresponding one of the second contact structures 142. A second conductive layer 18 of the conductive material may then be formed on the third dielectric layer 16.

Referring to FIG. 1I, the second conductive layer 18 may be removed by a CMP process using the third dielectric layer 16 as a polish-stopping layer. Top of the third contact structures 181 may be exposed thereafter.

Referring to FIG. 1J, a patterned metal layer 19 may be formed on the third dielectric layer 16 and the third contact structures 181. The patterned metal layer 19 may include bit lines extending in parallel in the first reference direction. Each of the third contact structures 181 may serve as a bit-line contact plug, which electrically couples one of the second contact structures 142 to one of the bit lines, while each of the second contact structures 142 may serve as a drain contact, which electrically couples the corresponding bit-line contact plug to the common drain region 11b. The first contact structure 141 which is electrically coupled with the common source region 11a may serve as a common-source line contact for source line pick-up.

With the increasing interest in compact and low-profile electronic products, the critical dimensions of the third openings 171 and the third contact structures 181 may be so small that process window will be a concern without high-resolution exposure tool. Furthermore, the third contact structures 181 and the second contact structures 142 are formed by two individual steps, which may increase the risk of mis-alignment without high-precision exposure tool. It may therefore be desirable to have a method that is able to manufacture semiconductor memory devices in a simplified process and alleviate the mis-alignment issue.

BRIEF SUMMARY OF THE INVENTION

The present invention is directed to a method for manufacturing a NAND flash device that may simplify the lithography processes and avoid the mis-alignment issue.

Examples of the present invention may provide a method of manufacturing a memory device. The method includes providing a substrate, forming a number of memory sectors on the substrate, wherein each of the memory sectors is coupled to an adjacent one via a first diffused region in the substrate and is coupled to another adjacent one via at least one second diffused region in the substrate, forming a first dielectric layer on the memory sectors, forming a first conductive structure through the first dielectric layer to the first diffused region, and at least one second conductive structure through the first dielectric layer to the at least one second diffused region, forming a patterned first mask layer on the first dielectric layer, the first conductive structure and the at least one second conductive structure, the patterned first mask layer exposing the first conductive structure, and etching back the first conductive structure.

Some examples of the present invention may also provide a method of manufacturing a memory device. The method includes providing a substrate, forming a number of memory sectors on the substrate, wherein each of the memory sectors is coupled to an adjacent one via a first diffused region in the substrate and is coupled to another adjacent one via at least one second diffused region in the substrate, forming a first dielectric layer on the memory sectors, forming a first opening through the first dielectric layer, exposing the first diffused region, and at least one second opening through the first dielectric layer, exposing the at least one second diffused region, forming a first conductive layer on the first dielectric layer, the first conductive layer filling the first opening, resulting in a first conductive structure, and filling the at least one second opening, resulting in at least one second conductive structure, forming a patterned first mask layer on the first conductive layer, the patterned first mask layer exposing a portion of the first conductive layer over the first conductive structure, etching back the exposed portion of the first conductive layer, and etching off the first conductive layer on the first dielectric layer so that the first conductive structure is etched back.

Examples of the present invention may further provide a method of manufacturing a memory device. The method includes providing a substrate, forming a number of memory sectors on the substrate, wherein each of the memory sectors is coupled to an adjacent one via a first diffused region in the substrate and is coupled to another adjacent one via at least one second diffused region in the substrate, forming a first dielectric layer on the memory sectors, forming a first opening through the first dielectric layer, exposing the first diffused region, and at least one second opening through the first dielectric layer, exposing the at least one second diffused region, forming a first conductive layer on the first dielectric layer, the first conductive layer filling the first opening, resulting in a first conductive structure, and filling the at least one second opening, resulting in at least one second conductive structure, forming a patterned first mask layer on the first conductive layer, the patterned first mask layer exposing a portion of the first conductive layer over the first conductive structure, and etching back the first conductive structure through the exposed portion of the first conductive layer, using the patterned first mask layer as a mask.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings:

FIGS. 1A to 1J are schematic cross-sectional views illustrating a method of fabricating a NAND flash device in prior art;

FIGS. 4A to 4F are schematic cross-sectional views illustrating a method of fabricating a NAND flash device in accordance with another example of the present invention;

FIGS. 5A to 5D are schematic cross-sectional views illustrating a method of fabricating a NAND flash device in accordance with yet another example of the present invention;

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions. It should be noted that the drawings are in greatly simplified form and are not to precise scale.

Figure 2A:
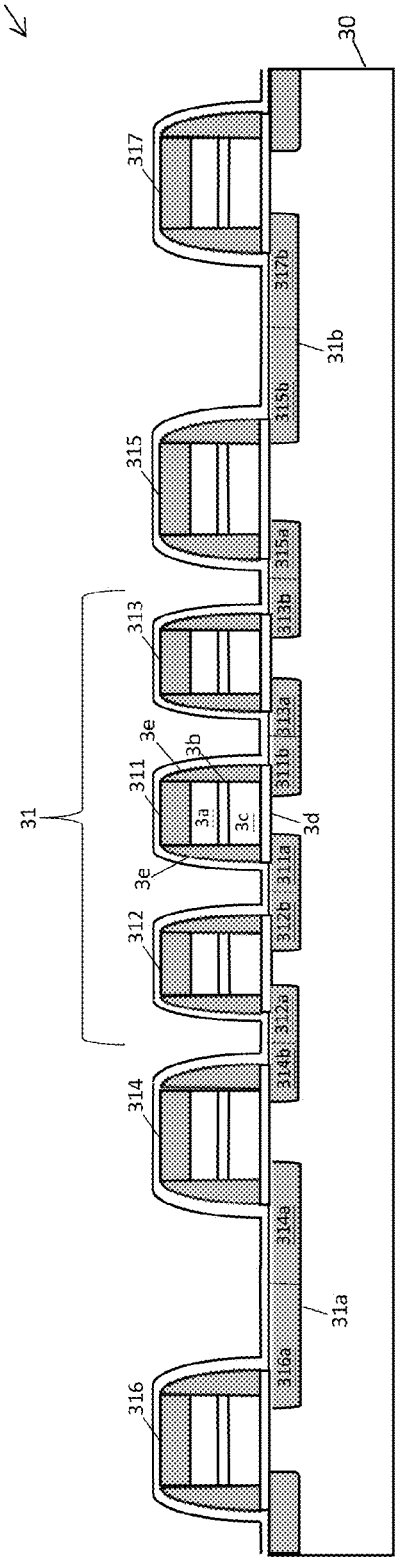
FIGS. 2A to 2P are schematic cross-sectional views illustrating a method of fabricating a NAND flash device in accordance with an example of the present invention.

FIGS. 2A to 2P are schematic cross-sectional views illustrating a method of fabricating a NAND flash device 3 in accordance with an example of the present invention. Throughout FIGS. 2A to 2P, only parts of the NAND flash device 3 are shown for simplicity. In addition to the exemplary NAND flash devices, the method according to the present invention may be applicable to the manufacturing of other semiconductor memory devices where mismatch between contact and via0 may concern.

Referring to FIG. 2A, a substrate 30 that has been doped with, for example, a p-type impurity, may be provided. A cell array of the NAND flash device 3 may be formed on the substrate 30. The cell array may include a number of units each further including a control gate layer 3$a$, a control gate oxide layer 3$b$, a floating gate layer 3$c$ and a floating gate oxide layer 3$d$. Spacers 3$e$ maybe formed along the sides of the gate structure to provide electrical isolation from adjacent units of the cell array. Furthermore, source and drain regions may be formed in the substrate 30 by, for example, an implantation followed by a diffusion process. The units of the cell array may extend in a first reference direction such as a row direction, and may be coupled with each other in series. For example, unit 311 may be coupled to unit 312 via a diffused region including a source region 311a and a drain region 312b, and coupled to unit 313 via another diffused region including a drain region 311b and a source region 313a. Skilled persons in the art will understand that source and drain regions may be interchangeable, depending on the voltages applied thereto.

A row of the serially coupled units of the cell array, for example, the exemplary units 312, 311 and 313, may be grouped as a NAND string 31. A source select gate 314 and a drain select gate 315 may be formed on each side of the NAND string 31. Furthermore, the drain region 314b of the source select gate 314 may be electrically coupled with the source region 312a of the unit 312 of the NAND string 31, and the source region 314a of the source select gate 314 may be electrically coupled with the source region 316a of a source select gate 316 of another NAND string (not shown) immediately adjacent to the NAND string 31 on one side in the same row. The diffused region including the source regions 314a and 316a is called a common source region 31a.

Likewise, the source region 315a of the drain select gate 315 may be electrically coupled with the drain region 313b of the unit 313 of the NAND string 31, while the drain region 315b of the drain select gate 315 may be electrically coupled with the drain region 317b of a drain select gate 317 of another NAND string (not shown) immediately adjacent to the NAND string 31 on the other side. The diffused region including the drain regions 315b and 317b is called a common drain region 31b.

Figure 1E:
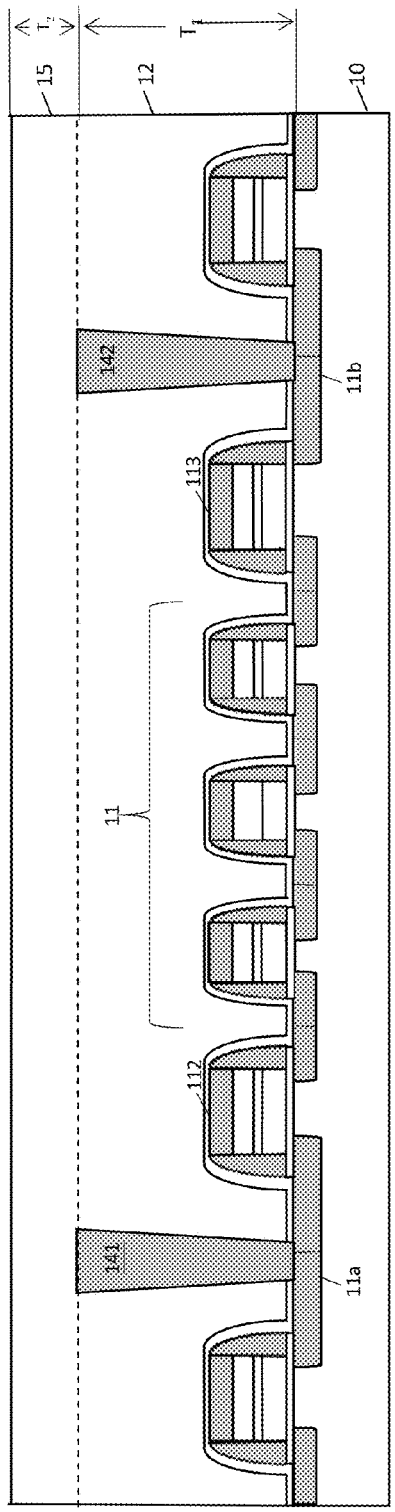
Figure 1F:
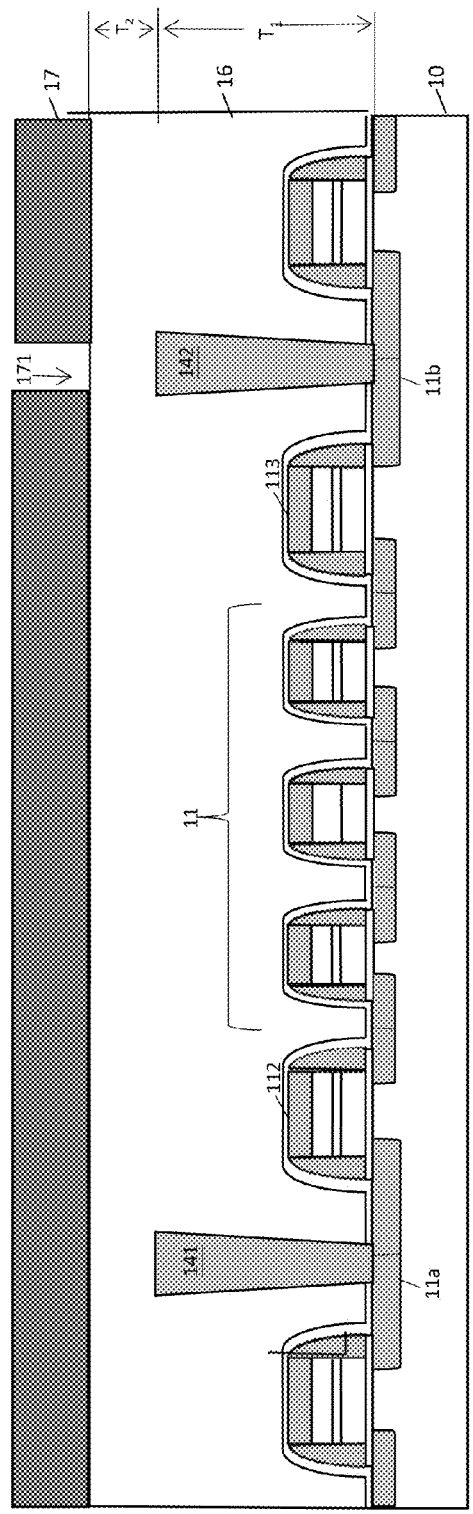
Figure 1I:
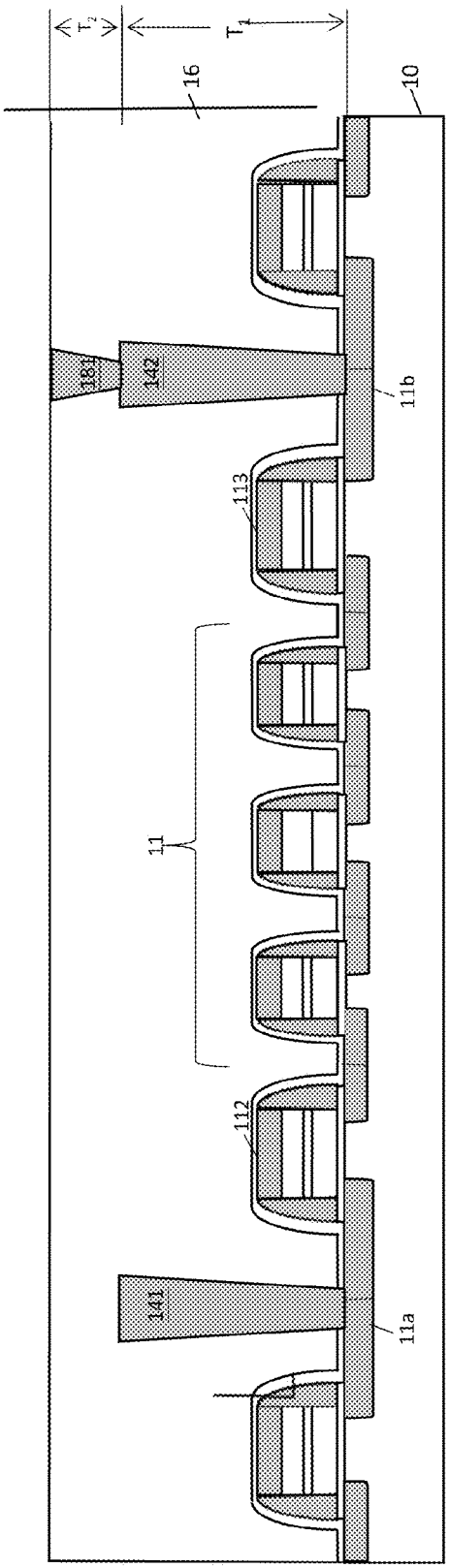
Figure 2B:
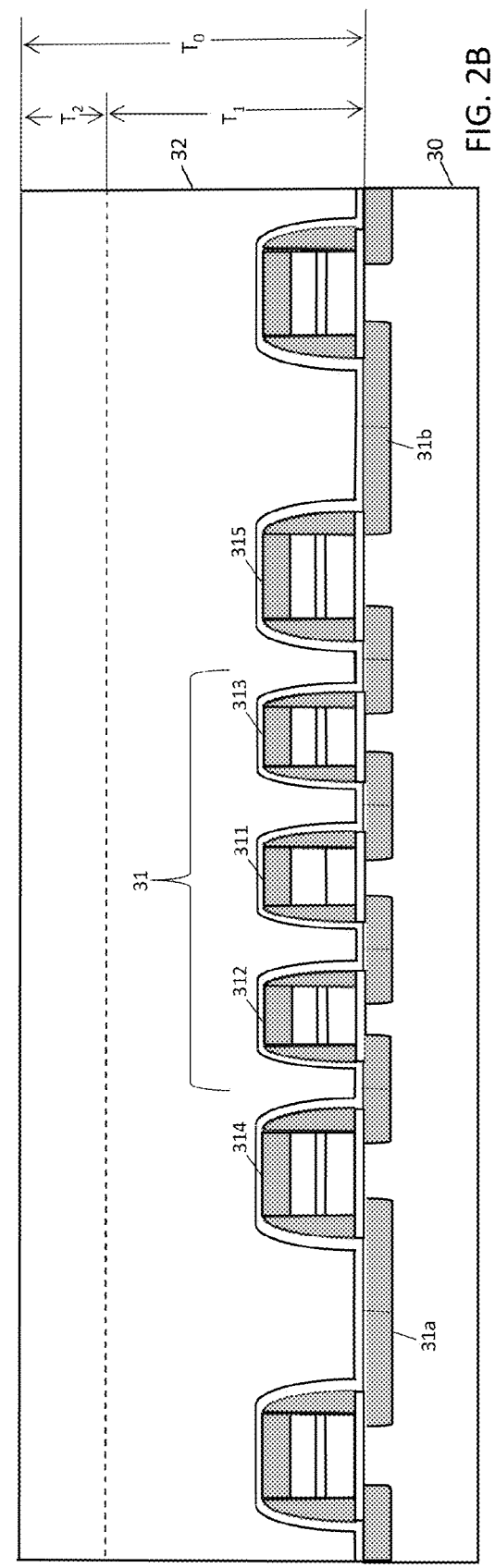

Referring to FIG. 2B, a first dielectric layer 32 may be formed on the cell array including the NAND string 31 between the source select gate 314 and the drain select gate 315 by, for example, a deposition process. The first dielectric layer 32 may include a dielectric material such as silicon oxide ($SiO_2$) or silicon oxynitride (SiON) with a thickness $T_0$. $T_0$ may be equal to $T_1$ plus $T_2$, wherein $T_1$ represents the height of the common-source-line contact, while $T_2$ represents the height of the bit-line contact plug of the NAND flash device manufactured by the conventional method illustrated in FIG. 1F.

Referring to FIG. 2C, a first mask layer 33 may be formed on the first dielectric layer 32 by a coating process. The first mask layer 33 may include photoresist.

Referring to FIG. 2D, a patterned first mask layer 33-1 may be formed by a lithography process. The patterned first mask layer 33-1 may expose portions 321 and 322 of the first dielectric layer 32 through a first opening 331a and a plurality of second openings 332a. The first opening 331a may extend in a second reference direction such as a column direction, while the second openings 322a may be arranged in a column in the second direction.

Referring to FIG. 2E, a first trench 323 and a plurality of holes 324 may be formed into the first dielectric layer 32 through the exposed portions 321 and 322, respectively, by a dry etch process, which uses the patterned first mask layer 33-1 as a mask. The first trench 323 may extend in the second reference direction and, due to the nature of dry etching, may be tapered from the exposed portion 321 of the patterned first mask layer 33-1 to the common source region 31a, exposing portions 31a1 of the common source region 31a.

Likewise, the holes 324 may be tapered from the exposed portions 322 of the patterned first mask layer 33-1 to the common drain region 31b, exposing portions 31b1 of the common drain region 31b.

Referring to FIG. 2F, the patterned first mask layer 33-1 may be removed by a strip process.

Referring to FIG. 2G, a conductive layer 34 may be formed on the first dielectric layer 32, filling the first trench 323 and the holes 324, by a deposition process such as a CVD process. The conductive layer 34 may include tungsten (W). The first trench 323 and the holes 324 filled with the conductive material form a first contact structure 331 and a plurality of second contact structures 332, respectively.

Referring to FIG. 2H, the conductive layer 34 on the first dielectric layer 32 may then be removed by a chemical-mechanical polish (CMP) process, using the first dielectric layer 32 as a polish-stopping layer. Top of the first contact structure 331 and second contact structures 332 may then be exposed.

Referring to FIG. 2I, a second mask layer 35 may be formed on the first dielectric layer 32. The second mask layer 35 may include photoresist.

Referring to FIG. 2J, a patterned second mask layer 35-1 may be formed on the first dielectric layer 32, exposing the first contact structure 331 and portions 325 of the first dielectric layer 32 around the first contact structure 331 through a third opening 351. The third opening 351 may extend in the second reference direction. The dimension of the third opening 351 may be substantially greater than that of the third opening 171 in the conventional method illustrated in FIG. 1F so that the lithography process for forming the third openings 351 may be simplified or require less resolution and precise exposure tool.

Referring to FIG. 2K, a second trench 326 may be formed into the first contact structure 331 through the exposed top thereof by a dry etch process, which uses the patterned second mask layer 35-1 as a mask. By controlling the time of the dry etch process, the first contact structure 331 may be etched back to a desired level so that the second trench 326 may have a depth equal to $T_2$.

Referring to FIG. 2L, the patterned second mask layer 35-1 may be removed by a strip process.

Referring to FIG. 2M, a second dielectric layer 36 may be formed on the first dielectric layer 32 by a deposition process, filling the second trench 326. The second dielectric layer 36 may include a dielectric material same as that of the first dielectric layer 32. Due to the second trench 326, a shallow trench 361 may exist in the top surface of the second dielectric layer 36.

Referring to FIG. 2N, since the second dielectric layer 36 and the first dielectric layer 32 include the same dielectric material, a third dielectric layer 37 composed of the first and second dielectric layers 32 and 36 may thus be defined.

Referring to FIG. 2O, the third dielectric layer 37 may be reduced in height by a CMP process using the second contact structure 332 as a polish-stopping layer, exposing top of the second contact structures 332. A reduced third dielectric layer 37-1 thus formed may serve as an inter layer dielectric (ILD) layer. The reduced third dielectric layer 37-1 may have the same height as the first dielectric layer 32.

Referring to FIG. 2P, a patterned metal layer 38 may be formed on the reduced third dielectric layer 37-1 and the second contact structures 332 by a CVD process. The patterned metal layer 38 may include bit lines. A first part of each the second contact structures 332 above the virtual dashed line may serve as a bit-line contact plug, which is electrically coupled with one of the bit lines, while the second part thereof under the virtual dashed line may serve as a drain contact, which is electrically coupled with the common drain region 31b. The first contact structure 331 which is electrically coupled with the common source region 31a may serve as a common-source line contact for source line pick-up.

Figure 1J:
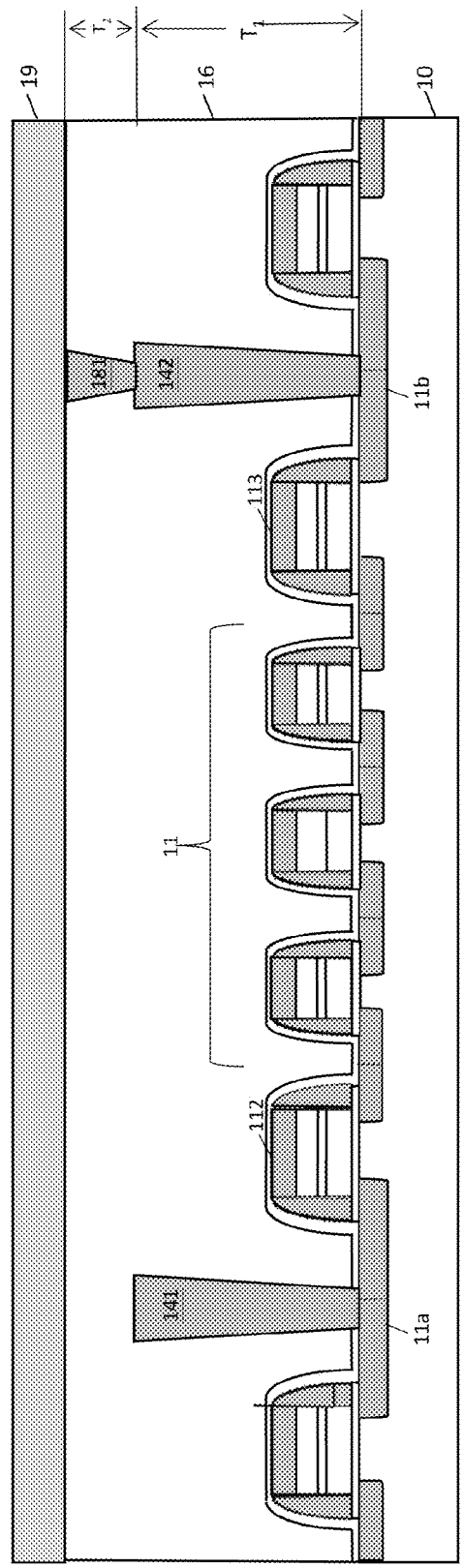

Unlike the drain contact 142 and bit-line contact plug 181 according to the conventional method illustrated in FIG. 1J, which are not simultaneously formed and thus suffer the mismatch issue, each of the second contact structures 332 includes a bit-line contact plug (the first part) and a drain contact (the second part), which are formed in one step and are substantially continuously tapered to the common drain region 31b. Accordingly, the mismatch or mis-alignment issue may be avoided.

Figure 3:
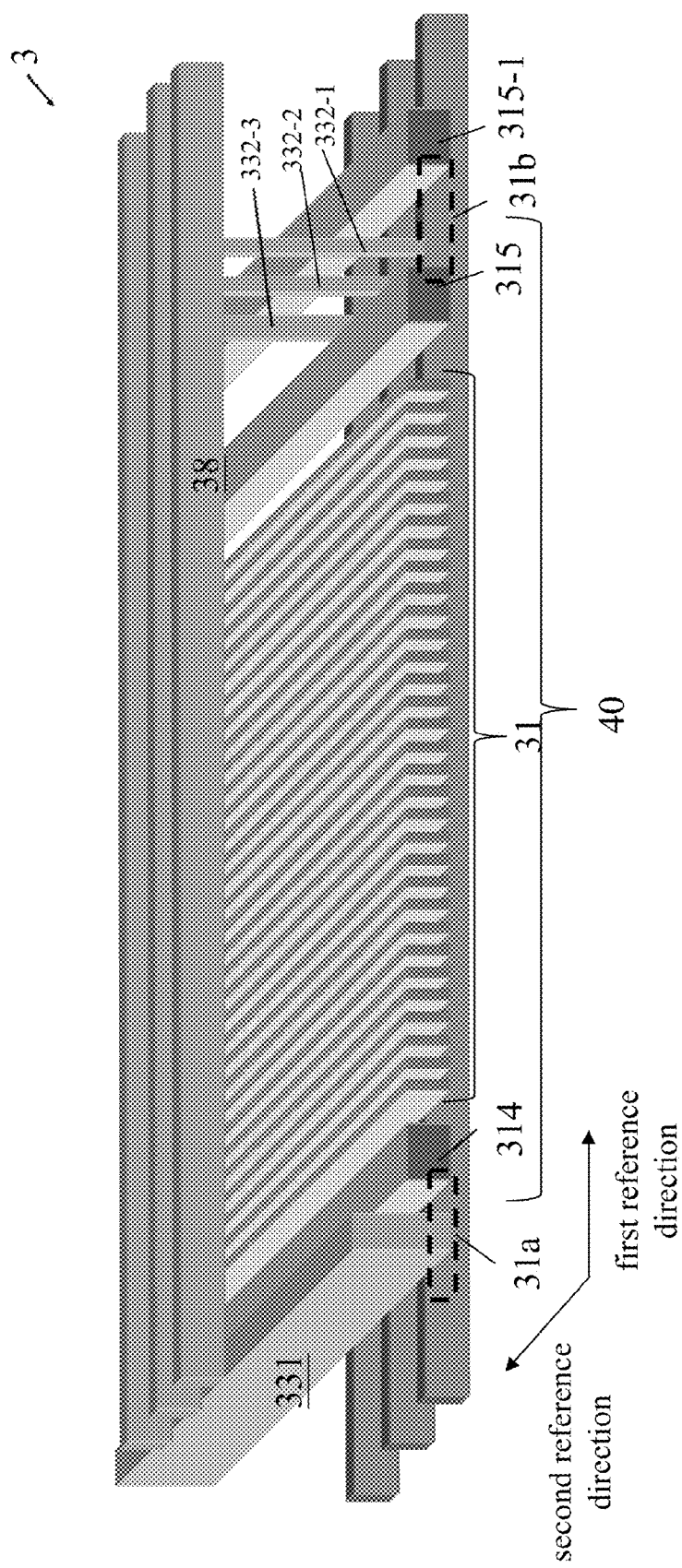
FIG. 3 is a schematic three-dimensional view of the NAND flash device in part fabricated by the method illustrated in FIG. 2P.

FIG. 3 is a schematic three-dimensional view of the NAND flash device 3 in part fabricated by the method illustrated in FIG. 2P. Referring to FIG. 3, a memory sector 40 of the NAND flash device 3 may include a first select gate (the source select gate) 314, a second select gate (the drain select gate) 315, and an array of memory devices such as a number of NAND strings 31 between the first and second select gates 314 and 315. Each of the NAND strings 31 may be coupled to the patterned metal layer 38 via a respective second contact structure, for example, one of exemplary contact structures 332-1, 332-2 and 332-3. Furthermore, a NAND string of the memory sector 40 may be coupled with an immediately adjacent NAND string of an adjacent memory sector via a first diffused region (the common source region 31a) and to another immediately adjacent NAND string of another adjacent memory sector via a second diffused region (the common drain region 31b).

FIGS. 4A to 4F are schematic cross-sectional views illustrating a method of manufacturing a NAND flash device in accordance with another example of the present invention.

The steps of forming a NAND string 51, a source select gate 514, a drain select gate 515, a common source region 51a and a common drain region 51b, forming a first dielectric layer 52, forming a first contact structure 541, a plurality of second contact structures 542 and forming a conductive layer 54 are substantially similar to those in the previously discussed example illustrated in FIGS. 2A to 2G, and hence the detailed descriptions are not discussed for simplicity. A resultant intermediate configuration of the NAND flash device from the foresaid steps is shown in FIG. 4A. The subsequent steps which are different from those in the previously discussed example will be described by reference to FIGS. 4B to 4F.

Referring to FIG. 4B, a second mask layer 55, for example, a photoresist layer, may be formed on the conductive layer 54 by a spin coating process. The second mask layer 55 may have a thickness $T_3$.

Referring to FIG. 4C, a patterned second mask layer 55-1 may then be formed, exposing a portion 543 of the conductive layer 54 through a third opening 551 over the first contact structure 541. The third opening 551 may extend in the second reference direction and vertically aligned with the first contact structure 541.

Referring to FIG. 4D, a second trench 544 may be formed into the conductive layer 54 through the exposed portion 543 thereof by a dry etch process which uses the patterned second mask layer 55-1 as a mask. The second trench 544 may have a depth equal to approximately $T_2$.

Referring to FIG. 4E, the patterned second mask layer 55-1 may be removed by a strip process.

Referring to FIG. 4F, the conductive layer 54 may then be removed by an etch process, which etches back the first contact structure 541 and exposes top of the second contact structures 542. With the etch-back process, a third trench 545 may be formed into the first contact structure 541. Since the second trench 544 may have a depth of $T_2$, the third trench 545 may also have a depth of $T_2$. Subsequently, the third trench 545 may be filled with a dielectric material and a conductive layer may be formed on the dielectric layer 52 and the second contact structures 542, which are similar to those in the method described and illustrated with reference to FIGS. 2M to 2P.

FIGS. 5A to 5D are schematic cross-sectional views illustrating a method of manufacturing a NAND flash device in accordance with yet another example of the present invention.

Figure 5A:
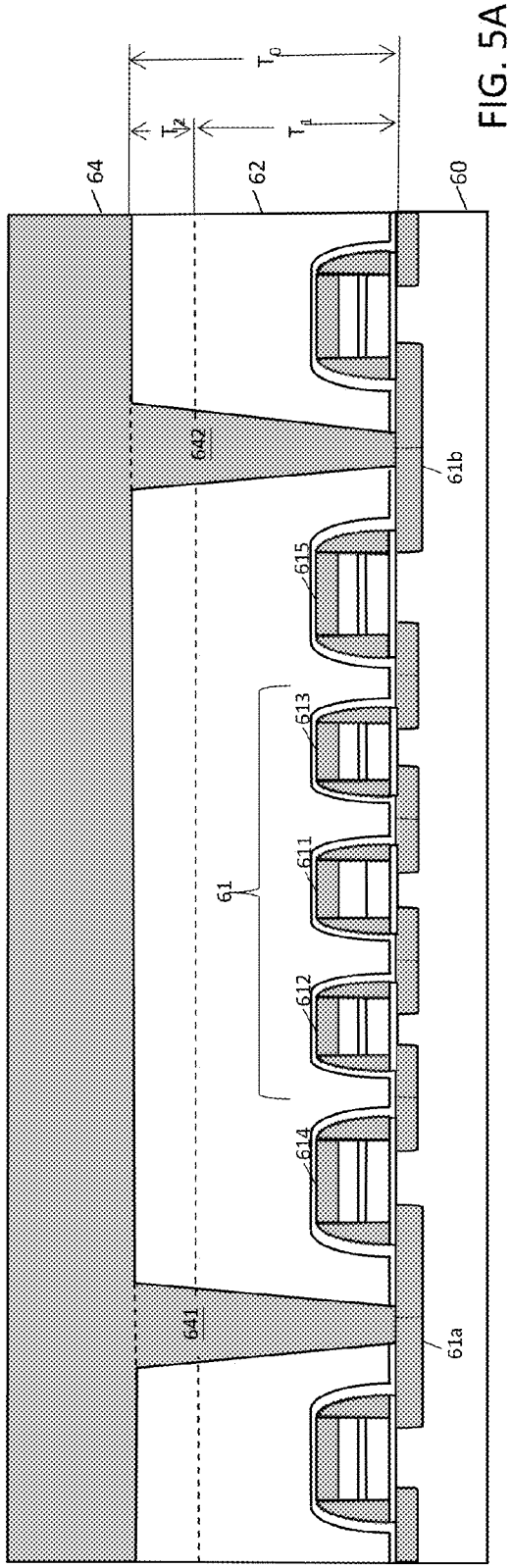

The steps of forming a NAND string 61, a source select gate 614, a drain select gate 615, a common source region 61a and a common drain region 61b, forming a first dielectric layer 62, forming a first contact structure 641, a plurality of second contact structures 642 and forming a conductive layer 64 are substantially similar to those in the previously discussed example illustrated in FIGS. 2A to 2G. A resultant intermediate configuration of the NAND flash device from the foresaid steps is shown in FIG. 5A.

Figure 5B:
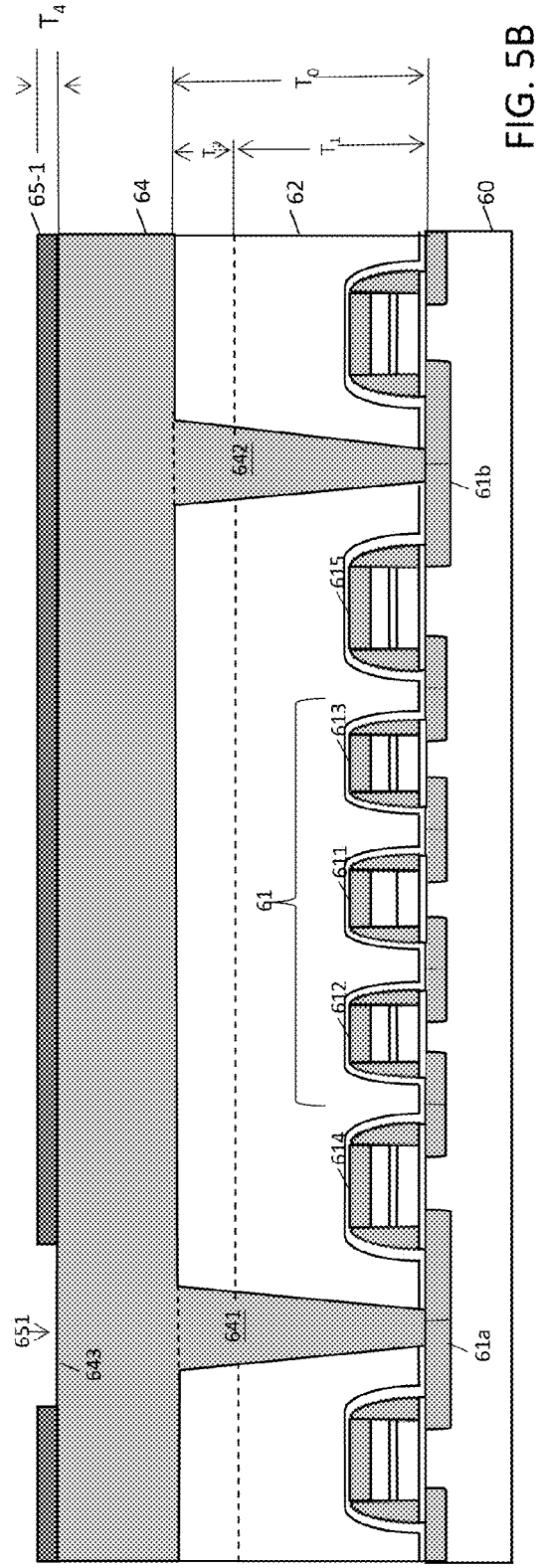

Next, referring to FIG. 5B, a patterned second mask layer 65-1 may be formed on the conductive layer 64. The patterned second mask layer 65-1 may include photoresist with a thickness $T_4$, wherein $T_4$ is smaller than $T_3$, the thickness of the second mask layer 55 illustrated in FIG. 4B. The patterned second mask layer 65-1 may expose a portion 643 of the conductive layer 64 through a third opening 651 over the first contact structure 641.

Referring to FIG. 5C, a second trench 644 may be formed into the conductive layer 64 through the exposed portion 643 by an etch-back process, which may consume the patterned second mask layer 65-1. The second trench 644 may have a depth substantially equal to $T_2$.

Referring to FIG. 5D, the conductive layer 64 may then be removed by an etch process, which etches back the first contact structure 641 and expose the second contact structures 642.

FIGS. 6A to 6D are schematic cross-sectional views illustrating a method of manufacturing a NAND flash device in accordance with still another example of the present invention.

Figure 6A:
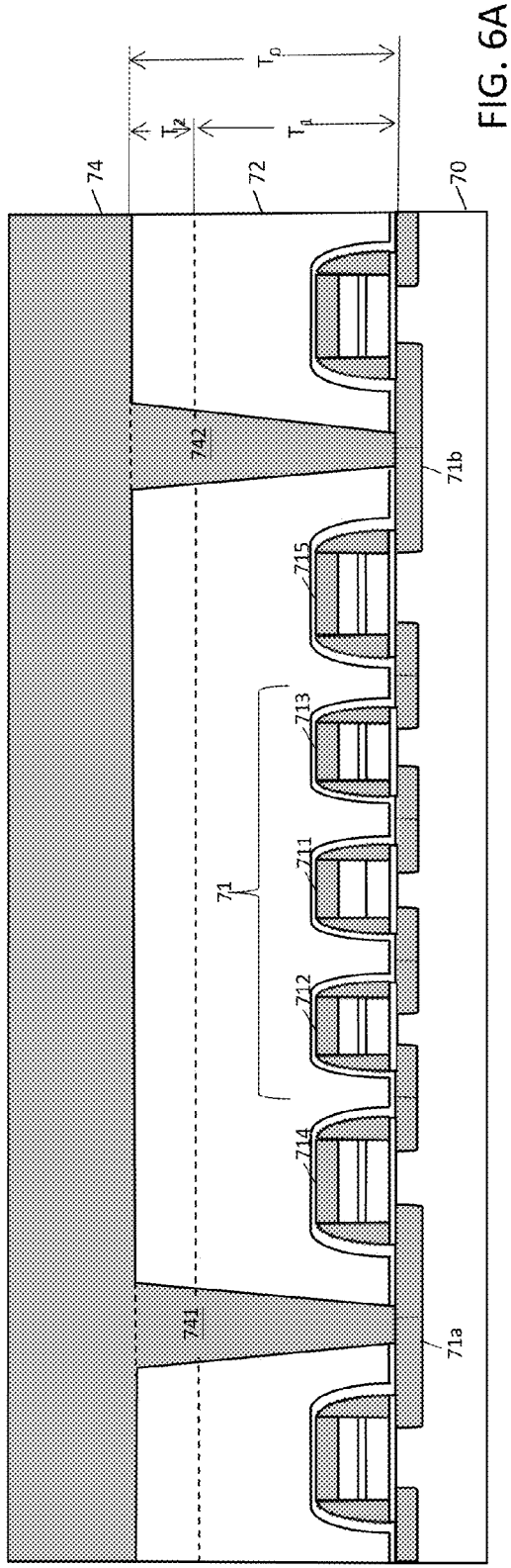
FIGS. 6A to 6D are schematic cross-sectional views illustrating a method of fabricating a NAND flash device in accordance with still another example of the present invention.

The steps of forming a NAND string 71, a source select gate 714, a drain select gate 715, a common source region 71a and a common drain region 71b, forming a first dielectric layer 72, forming a first contact structure 741, a plurality of second contact structures 742 and forming a conductive layer 74 are substantially similar to those in the previously discussed example illustrated in FIGS. 2A to 2G. A resultant intermediate configuration of the NAND flash device from the foresaid steps is shown in FIG. 6A.

Figure 6B:
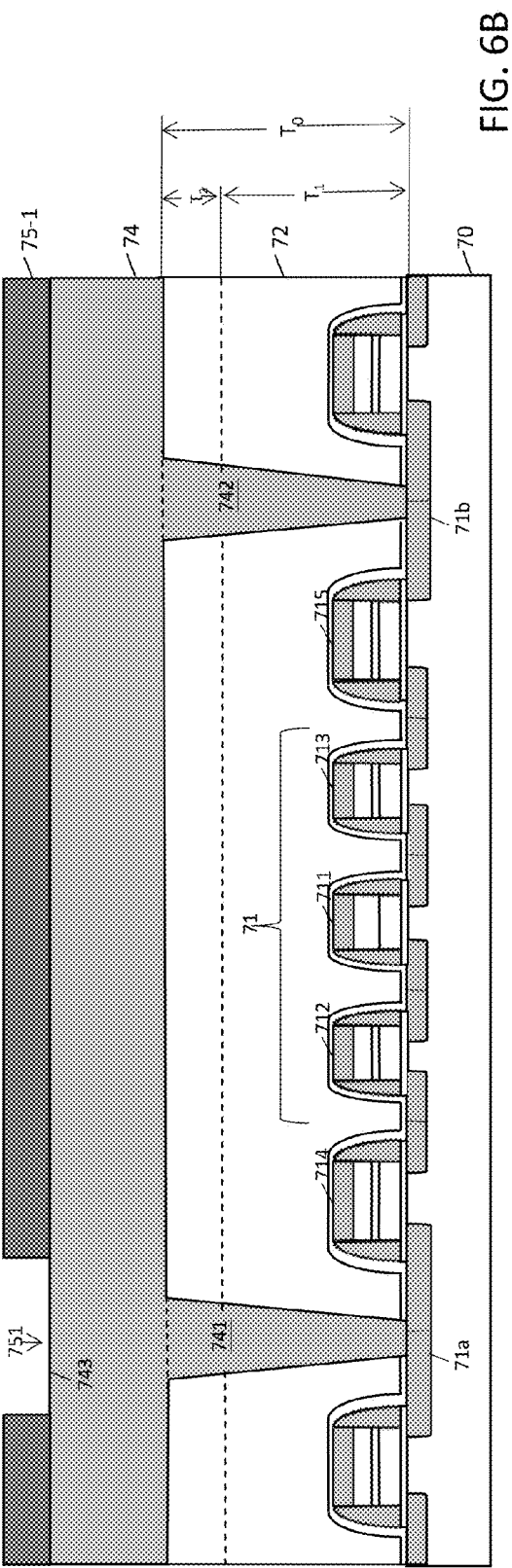

Referring to FIG. 6B, a patterned second mask layer 75-1 may be formed on the conductive layer 74, which exposes a portion 743 of the conductive layer 74 through a third opening 751 over the first contact structure 741.

Figure 6C:
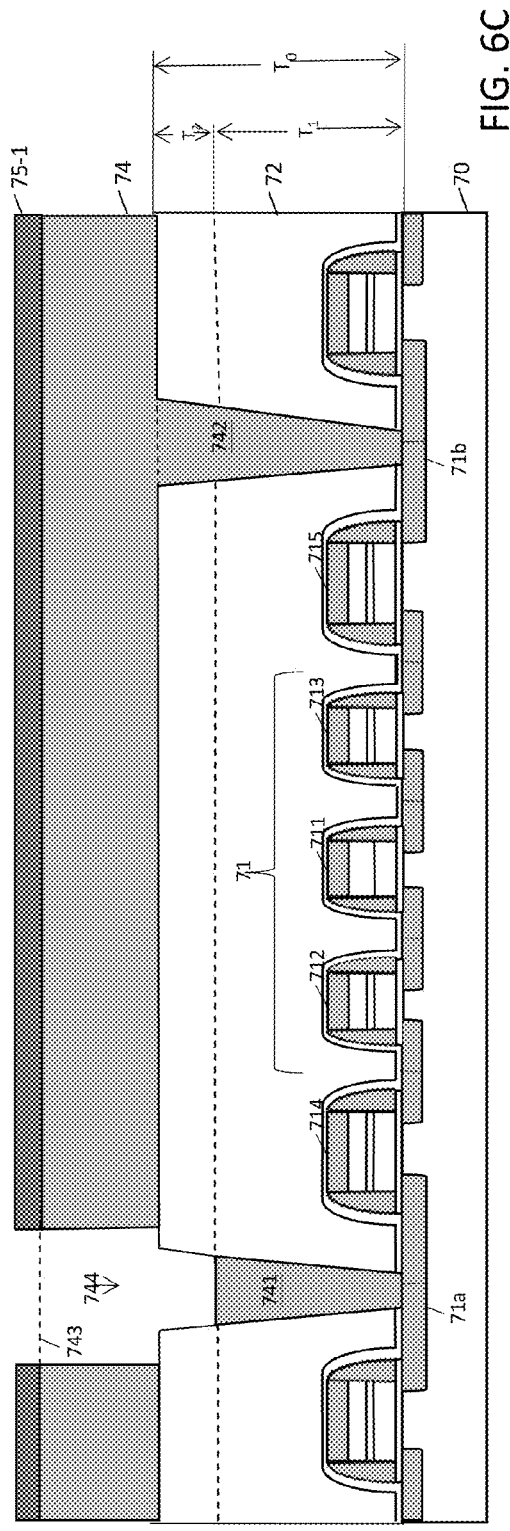

Referring to FIG. 6C, a second trench 744 may be formed into the conductive layer 74 through the exposed portion 743 by an etch process, for example, a dry etch process, which etches back the first contact structure 741.

Figure 6D:
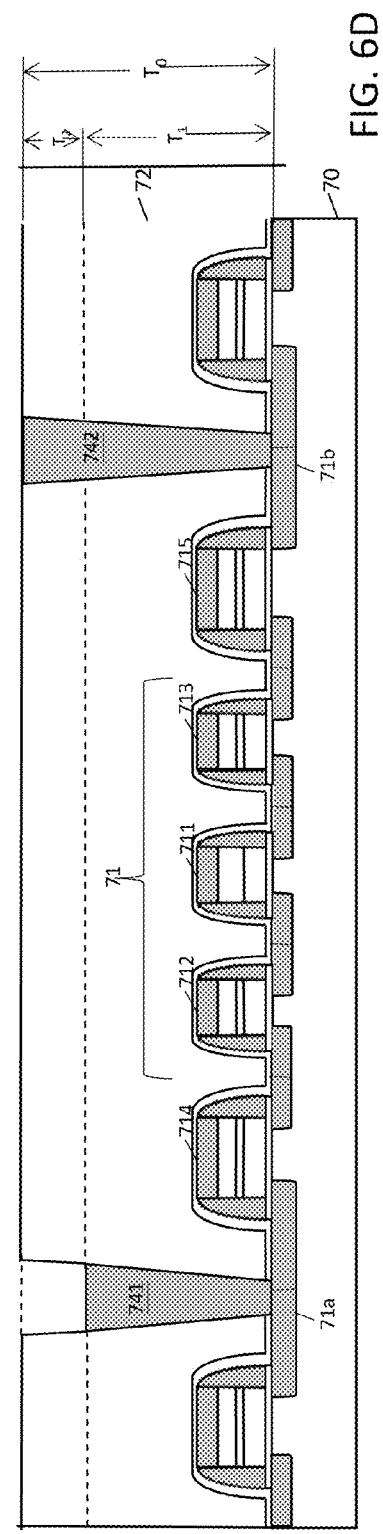

Referring to FIG. 6D, the residual patterned second mask layer 75-1 may be removed by a strip process and then the conductive layer 74 may be removed by a CMP process using the first dielectric layer 72 as a polish-stopping layer. The subsequent steps may be similar to those described and illustrated with reference to FIGS. 2M to 2P and are not discussed.

Figure 7A:
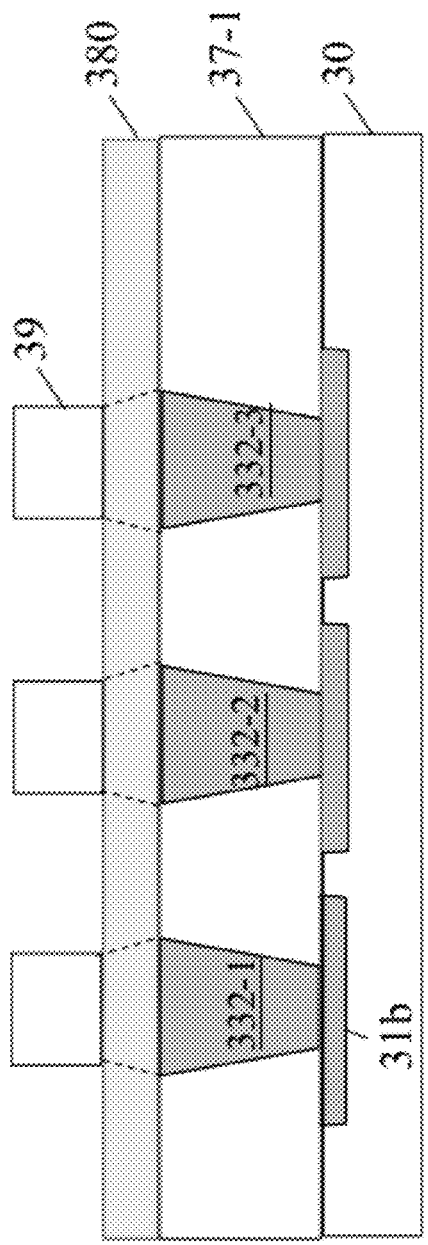
FIGS. 7A and 7B are schematic cross-sectional views illustrating a method of fabricating a NAND flash device in accordance with an example of the present invention.
Figure 7B:
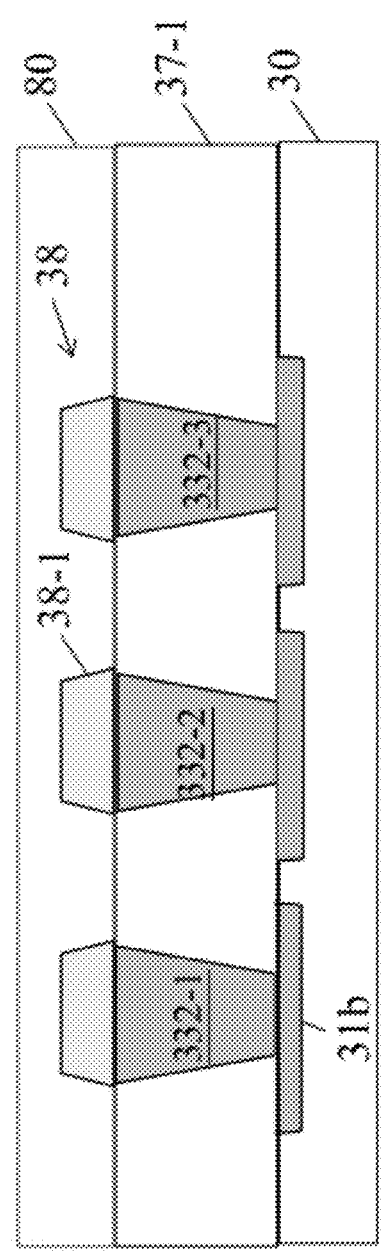

FIGS. 7A and 7B are schematic cross-sectional views illustrating a method of fabricating a NAND flash device in accordance with an example of the present invention. Referring back to FIG. 2N, the dielectric layer 37 is polished to such an extent that the second contact structures 332 are exposed, resulting in the dielectric layer 37-1 illustrated in FIG. 7A. Referring to FIG. 7A, which is taken along the second reference direction over the second contact structures 332, a conductive layer 380 may be formed on the polished dielectric layer 37-1 by a deposition process. Next, a patterned photoresist layer 39 may be formed on the conductive layer 380, exposing portions of the conductive layer 380 and substantially masking the second contact structures 332-1, 332-2 and 332-3.

Referring to FIG. 7B, the exposed portions of the conductive layer 380 may be removed by an etch process, resulting in the patterned conductive layer 38 on the second conductive structures 332-1 to 332-3. The patterned conductive layer 38 may include conductive lines 38-1, each of which in one example may have a shape tapered from the top of the second contact structure 332-1, 332-2 or 332-3. Next, another dielectric layer 80 may be formed on the patterned conductive layer 38 and the dielectric layer 37-1.

Figure 8A:
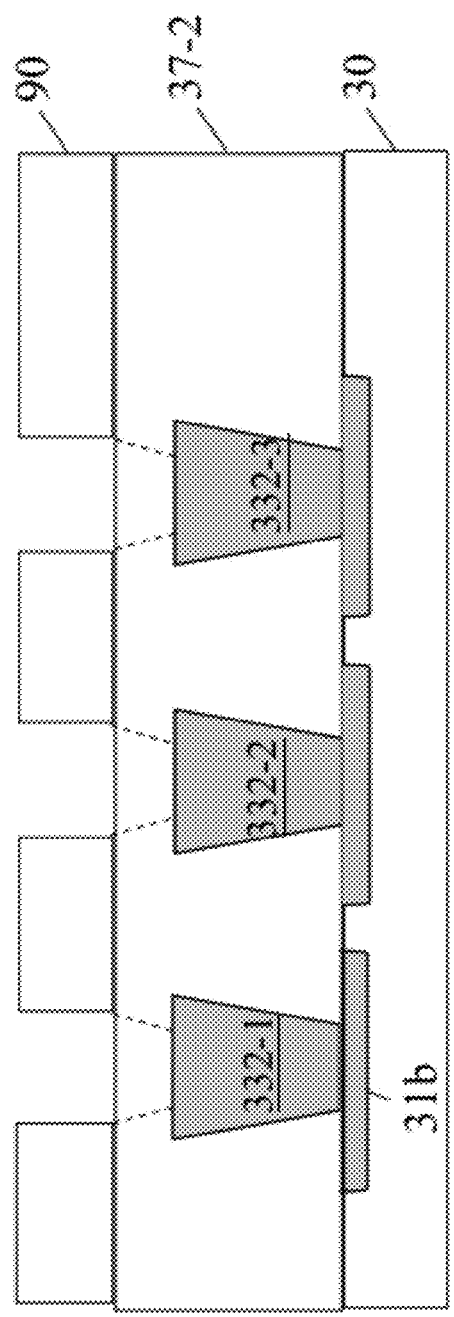
FIGS. 8A and 8B are schematic cross-sectional views illustrating a method of fabricating a NAND flash device in accordance with another example of the present invention.
Figure 8B:
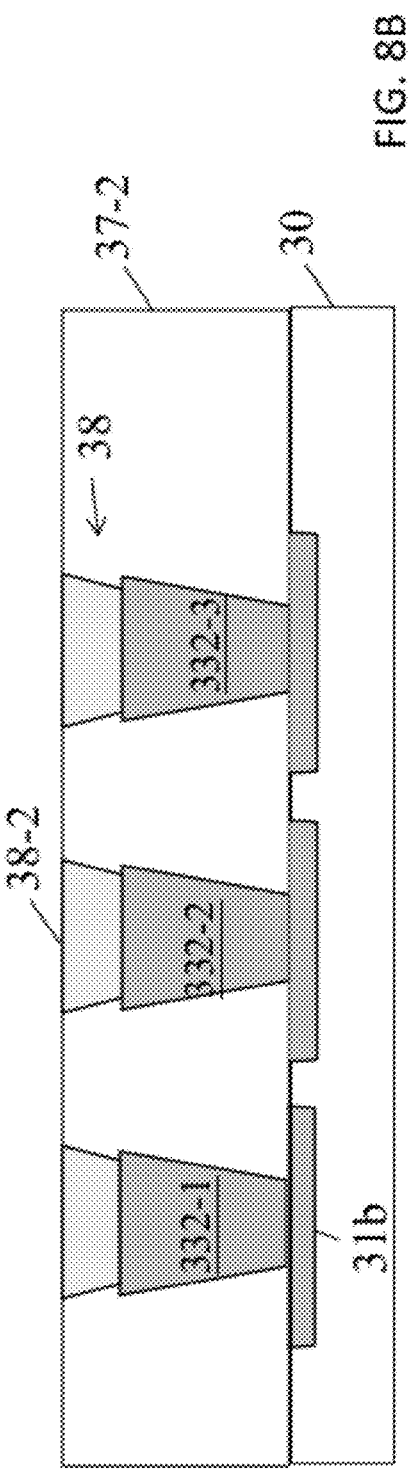

As an alternative, the patterned conductive layer 38 may be formed by a damascene process. FIGS. 8A and 8B are schematic cross-sectional views illustrating a method of fabricating a NAND flash device in accordance with another example of the present invention. Referring back to FIG. 2N, the dielectric layer 37 may be polished to such an extent that the second contact structures 332 are not exposed, resulting in a dielectric layer 37-2 illustrated in FIG. 8A. Referring to FIG. 8A, a patterned photoresist layer 90 may be formed on the dielectric layer 37-2, exposing portions of the dielectric layer 37-2 over the second contact structures 332-1 to 332-3. Next, the exposed portions of the dielectric layer 37-2 may be removed, exposing a portion of each of the second contact structures 332-1 to 332-3 through holes (not numbered).

Referring to FIG. 8B, a conductive layer may be formed on the dielectric layer 37-2, filling the holes, and then the conductive layer on the dielectric layer 37-2 may be removed, resulting in the patterned conductive layer 38. The patterned conductive layer 38 may include conductive lines 38-2, each of which in one example may have a shape tapered to the top of the second contact structure 332-1, 332-2 or 332-3.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A method of manufacturing a memory device, the method comprising:
   providing a substrate;
   forming a number of memory sectors on the substrate, each of the memory sectors coupled to an adjacent one via a first diffused region in the substrate and coupled to another adjacent one via at least one second diffused region in the substrate;
   forming a first dielectric layer on the memory sectors;
   forming a first conductive structure through the first dielectric layer to the first diffused region, and forming at least one second conductive structure through the first dielectric layer to the at least one second diffused region;
   forming a patterned first mask layer on the first dielectric layer, the first conductive structure and the at least one second conductive structure, the patterned first mask layer exposing the first conductive structure;
   etching back the first conductive structure;
   removing the patterned first mask layer;
   forming a second dielectric layer on the first dielectric layer and the at least one second conductive structure; and
   leveling the second dielectric layer, wherein leveling the second dielectric layer exposes the at least one second conductive structure, further comprising:
       forming a conductive layer on the leveled second dielectric layer and the at least one second conductive structure;
       forming a patterned second mask layer on the conductive layer, the patterned second mask layer masking portions of the conductive layer over the at least one second conductive structure; and
       removing the exposed portions of the conductive layer, resulting in a patterned conductive layer.

2. The method of claim 1, wherein each of the at least one second conductive structure has a shape tapered toward one of the at least one second diffused region, and the patterned conductive layer includes conductive lines each having a shape tapered from one of the at least one second conductive structure.

3. The method of claim 1, wherein each of the memory sectors includes a first select gate, a second select gate and a number of NAND strings between the first select gate and the second select gate.

4. A method of manufacturing a memory device, the method comprising:
   providing a substrate;
   forming a number of memory sectors on the substrate, each of the memory sectors coupled to an adjacent one via a first diffused region in the substrate and coupled to another adjacent one via at least one second diffused region in the substrate;
   forming a first dielectric layer on the memory sectors;
   forming a first conductive structure through the first dielectric layer to the first diffused region, and forming at least one second conductive structure through the first dielectric layer to the at least one second diffused region;
   forming a patterned first mask layer on the first dielectric layer, the first conductive structure and the at least one second conductive structure, the patterned first mask layer exposing the first conductive structure;
   etching back the first conductive structure;
   removing the patterned first mask layer;
   forming a second dielectric layer on the first dielectric layer and the at least one second conductive structure; and leveling the second dielectric layer, wherein leveling the second dielectric layer leaves the at least one second conductive structure unexposed, further comprising:

forming a patterned second mask layer on the leveled second dielectric layer, the patterned second mask layer exposing portions of the leveled second dielectric layer over the at least one second conductive structure; and removing the exposed portions of the leveled second dielectric layer, resulting in a patterned second dielectric layer;

removing the patterned second mask layer; and forming a conductive layer on the patterned second dielectric layer.

5. The method of claim 4, wherein each of the at least one second conductive structure has a shape tapered toward one of the at least one second diffused region, and the conductive layer includes conductive lines each having a shape tapered toward one of the at least one second conductive structure.

6. A method of manufacturing a memory device, the method comprising:

providing a substrate;

forming a number of memory sectors on the substrate, each of the memory sectors coupled to an adjacent one via a first diffused region in the substrate and coupled to another adjacent one via at least one second diffused region in the substrate;

forming a first dielectric layer on the memory sectors;

forming a first opening through the first dielectric layer, exposing the first diffused region, and at least one second opening through the first dielectric layer, exposing the at least one second diffused region;

forming a first conductive layer on the first dielectric layer, the first conductive layer filling the first opening, resulting in a first conductive structure, and filling the at least one second opening, resulting in at least one second conductive structure;

forming a patterned first mask layer on the first conductive layer, the patterned first mask layer exposing a portion of the first conductive layer over the first conductive structure;

etching back the exposed portion of the first conductive layer;

etching off the first conductive layer on the first dielectric layer so that the first conductive structure is etched back;

removing the patterned first mask layer;

forming a second dielectric layer on the first dielectric layer and the at least one second conductive structure; and leveling the second dielectric layer, wherein leveling the second dielectric layer exposes the at least one second conductive structure, further comprising:

forming a second conductive layer on the leveled second dielectric layer and the at least one second conductive structure;

forming a patterned second mask layer on the second conductive layer, the patterned second mask layer masking portions of the second conductive layer over the at least one second conductive structure; and removing the exposed portions of the second conductive layer, resulting in a patterned second conductive layer.

7. The method of claim 6, wherein the patterned first mask layer is removed during etching back the exposed portion of the first conductive layer.

8. The method of claim 6, wherein each of the at least one second conductive structure has a shape tapered toward one of the at least one second diffused region, and the patterned second conductive layer includes conductive lines each having a shape tapered from one of the at least one second conductive structure.

9. A method of manufacturing a memory device, the method comprising:

providing a substrate;

forming a number of memory sectors on the substrate, each of the memory sectors coupled to an adjacent one via a first diffused region in the substrate and coupled to another adjacent one via at least one second diffused region in the substrate;

forming a first dielectric layer on the memory sectors;

forming a first opening through the first dielectric layer, exposing the first diffused region, and at least one second opening through the first dielectric layer, exposing the at least one second diffused region;

forming a first conductive layer on the first dielectric layer, the first conductive layer filling the first opening, resulting in a first conductive structure, and filling the at least one second opening, resulting in at least one second conductive structure;

forming a patterned first mask layer on the first conductive layer, the patterned first mask layer exposing a portion of the first conductive layer over the first conductive structure;

etching back the exposed portion of the first conductive layer;

etching off the first conductive layer on the first dielectric layer so that the first conductive structure is etched back;

removing the patterned first mask layer;

forming a second dielectric layer on the first dielectric layer and the at least one second conductive structure; and leveling the second dielectric layer, wherein leveling the second dielectric layer leaves the at least one second conductive structure unexposed, further comprising:

forming a patterned second mask layer on the leveled second dielectric layer, the patterned second mask layer exposing portions of the leveled second dielectric layer over the at least one second conductive structure; and removing the exposed portions of the leveled second dielectric layer, resulting in a patterned second dielectric layer;

removing the patterned second mask layer; and forming a second conductive layer on the patterned second dielectric layer.

10. The method of claim 9, wherein each of the at least one second conductive structure has a shape tapered toward one of the at least one second diffused region, and the second conductive layer includes conductive lines each having a shape tapered toward one of the at least one second conductive structure.

11. A method of manufacturing a memory device, the method comprising:

providing a substrate;

forming a number of memory sectors on the substrate, each of the memory sectors coupled to an adjacent one via a first diffused region in the substrate and coupled to another adjacent one via at least one second diffused region in the substrate;

forming a first dielectric layer on the memory sectors;

forming a first opening through the first dielectric layer, exposing the first diffused region, and at least one second opening through the first dielectric layer, exposing the at least one second diffused region;

forming a first conductive layer on the first dielectric layer, the first conductive layer filling the first opening, resulting in a first conductive structure, and filling the at least one second opening, resulting in at least one second conductive structure;

forming a patterned first mask layer on the first conductive layer, the patterned first mask layer exposing a portion of the first conductive layer over the first conductive structure;

etching back the first conductive structure through the exposed portion of the first conductive layer, using the patterned first mask layer as a mask;

removing the patterned first mask layer;

forming a second dielectric layer on the first dielectric layer and the at least one second conductive structure; and leveling the second dielectric layer, wherein leveling the second dielectric layer exposes the at least one second conductive structure, further comprising:

forming a second conductive layer on the leveled second dielectric layer and the at least one second conductive structure;

forming a patterned second mask layer on the second conductive layer, the patterned second mask layer masking portions of the second conductive layer over the at least one second conductive structure; and removing the exposed portions of the second conductive layer, resulting in a patterned second conductive layer.

12. The method of claim 11, wherein each of the at least one second conductive structure has a shape tapered toward one of the at least one second diffused region, and the patterned second conductive layer includes conductive lines each having a shape tapered from one of the at least one second conductive structure.

13. A method of manufacturing a memory device, the method comprising:

providing a substrate;

forming a number of memory sectors on the substrate, each of the memory sectors coupled to an adjacent one via a first diffused region in the substrate and coupled to another adjacent one via at least one second diffused region in the substrate;

forming a first dielectric layer on the memory sectors;

forming a first opening through the first dielectric layer, exposing the first diffused region, and at least one second opening through the first dielectric layer, exposing the at least one second diffused region;

forming a first conductive layer on the first dielectric layer, the first conductive layer filling the first opening, resulting in a first conductive structure, and filling the at least one second opening, resulting in at least one second conductive structure;

forming a patterned first mask layer on the first conductive layer, the patterned first mask layer exposing a portion of the first conductive layer over the first conductive structure;

etching back the first conductive structure through the exposed portion of the first conductive layer, using the patterned first mask layer as a mask;

removing the patterned first mask layer;

forming a second dielectric layer on the first dielectric layer and the at least one second conductive structure; and leveling the second dielectric layer, wherein leveling the second dielectric layer leaves the at least one second conductive structure unexposed, further comprising:

forming a patterned second mask layer on the leveled second dielectric layer, the patterned second mask layer exposing portions of the leveled second dielectric layer over the at least one second conductive structure; and removing the exposed portions of the leveled second dielectric layer, resulting in a patterned second dielectric layer;

removing the patterned second mask layer; and forming a second conductive layer on the patterned second dielectric layer.

14. The method of claim 13, wherein each of the at least one second conductive structure has a shape tapered toward one of the at least one second diffused region, and the second conductive layer includes conductive lines each having a shape tapered toward one of the at least one second conductive structure.

* * * * *